(12) United States Patent
Lau

(10) Patent No.: US 12,342,502 B2
(45) Date of Patent: Jun. 24, 2025

(54) TWO-PHASE IMMERSION COOLING APPARATUS WITH ACTIVE VAPOR MANAGEMENT

(71) Applicant: LIQUIDSTACK HOLDING B.V., Amsterdam (NL)

(72) Inventor: Kar-Wing Lau, Hong Kong (HK)

(73) Assignee: LIQUIDSTACK HOLDING B.V., Amsterdam (NL)

( * ) Notice: Subject to any disclaimer, the term of this patent is extended or adjusted under 35 U.S.C. 154(b) by 331 days.

(21) Appl. No.: 18/101,872

(22) Filed: Jan. 26, 2023

(65) Prior Publication Data

US 2023/0171923 A1 Jun. 1, 2023

Related U.S. Application Data

(63) Continuation of application No. PCT/EP2021/055404, filed on Mar. 3, 2021.

(51) Int. Cl.
*H05K 7/20* (2006.01)
*F28F 27/02* (2006.01)
*G01F 1/74* (2006.01)

(52) U.S. Cl.
CPC ......... *H05K 7/20281* (2013.01); *F28F 27/02* (2013.01); *G01F 1/74* (2013.01); *H05K 7/20236* (2013.01); *H05K 7/203* (2013.01); *H05K 7/20318* (2013.01); *H05K 7/20327* (2013.01); *H05K 7/20818* (2013.01)

(58) Field of Classification Search
CPC ........... H05K 7/20281; H05K 7/20236; H05K 7/203; H05K 7/20318; H05K 7/20327; H05K 7/20818; F28F 27/02; G01F 1/74

USPC ........................................................ 165/274
See application file for complete search history.

(56) References Cited

U.S. PATENT DOCUMENTS

| | | |
|---|---|---|
| 2,083,611 A | 6/1937 | Marshall |
| 2,340,898 A | 2/1944 | Race |
| 2,767,693 A | 10/1956 | Foutz |
| 2,882,449 A | 4/1959 | Beurtheret |
| 2,961,476 A | 11/1960 | Maslin et al. |
| 3,009,124 A | 11/1961 | Narbut |
| 3,263,491 A | 8/1966 | Brown et al. |
| 3,308,839 A | 3/1967 | Barday |
| 3,512,582 A | 5/1970 | Chu et al. |
| 3,586,101 A | 6/1971 | Chu et al. |
| 3,609,991 A | 10/1971 | Chu et al. |
| 3,675,395 A | 7/1972 | Baranowski |
| 3,728,518 A | 4/1973 | Kodaira |
| 3,774,677 A | 11/1973 | Antonetti et al. |
| 3,855,449 A | 12/1974 | Schneider |
| 3,934,453 A | 1/1976 | Hessen |
| 3,989,102 A | 11/1976 | Jaster et al. |
| 4,020,399 A | 4/1977 | Suzuki et al. |
| 4,089,662 A | 5/1978 | Williams |

(Continued)

*Primary Examiner* — Claire E Rojohn, III

(57) ABSTRACT

A two-phase immersion cooling apparatus may include an immersion tank with a primary condenser in thermal communication with an interior volume of the immersion tank and a vapor management system fluidically connected to the immersion tank. The vapor management system may enable the apparatus to effectively manage periods of high vapor production by removing vapor and other gases from a headspace of the immersion tank, condensing the vapor to liquid, and returning the liquid to the immersion tank.

20 Claims, 17 Drawing Sheets

(56) References Cited

U.S. PATENT DOCUMENTS

| | | | |
|---|---|---|---|
| 4,352,342 A | 10/1982 | Cser et al. | |
| 4,437,082 A | 3/1984 | Walsh et al. | |
| 4,514,294 A | 4/1985 | Layman et al. | |
| 4,581,477 A | 4/1986 | Harumoto et al. | |
| 4,680,001 A | 7/1987 | Waters | |
| 4,737,604 A | 4/1988 | Piesche et al. | |
| 4,781,826 A | 11/1988 | Mendiratta et al. | |
| 4,790,337 A | 12/1988 | Fowler | |
| 4,814,021 A | 3/1989 | Massey et al. | |
| 4,857,150 A | 8/1989 | Rival et al. | |
| 4,967,832 A | 11/1990 | Porter | |
| 5,186,242 A | 2/1993 | Adachi et al. | |
| 5,211,856 A | 5/1993 | Shen | |
| 5,293,754 A | 3/1994 | Mizuno | |
| 5,522,452 A | 6/1996 | Mizuno et al. | |
| 5,529,115 A | 6/1996 | Paterson | |
| 5,823,248 A * | 10/1998 | Kadota | F25B 23/006 165/104.33 |
| 6,135,067 A * | 10/2000 | Klamm | F01P 11/0285 165/104.32 |
| 7,077,189 B1 | 7/2006 | Reyzin et al. | |
| 7,410,615 B2 | 8/2008 | Krug et al. | |
| 7,556,089 B2 | 7/2009 | Bhatti et al. | |
| 7,818,093 B2 | 10/2010 | Boger | |
| 7,859,819 B2 | 12/2010 | Fahrenback et al. | |
| 8,184,436 B2 | 5/2012 | Campbell et al. | |
| 9,313,931 B2 | 4/2016 | Goth et al. | |
| 9,410,751 B2 | 8/2016 | David et al. | |
| 9,844,166 B2 | 12/2017 | Shelnutt et al. | |
| 10,064,313 B2 | 8/2018 | Ishinabe et al. | |
| 10,143,113 B2 * | 11/2018 | Shelnutt | G06F 1/20 |
| 10,470,337 B2 * | 11/2019 | Uchida | F25D 9/00 |
| 10,477,726 B1 | 11/2019 | Enright et al. | |
| 10,653,043 B2 | 5/2020 | Enright et al. | |
| 10,966,349 B1 * | 3/2021 | Lau | H05K 7/20236 |
| 11,076,508 B2 * | 7/2021 | Gao | H05K 7/20818 |
| 11,101,630 B1 * | 8/2021 | Lau | H05K 7/20318 |
| 11,612,081 B2 * | 3/2023 | Gao | H05K 7/20327 |
| 11,744,043 B2 * | 8/2023 | Gao | H05K 7/203 361/679.53 |
| 11,963,332 B2 * | 4/2024 | Gao | H05K 7/203 |
| 11,968,804 B2 * | 4/2024 | Tung | F28D 15/0266 |
| 12,004,325 B2 * | 6/2024 | Chen | H05K 7/20818 |
| 12,035,508 B2 * | 7/2024 | Enright | H05K 7/203 |
| 12,041,751 B2 * | 7/2024 | Jian | H05K 7/20318 |
| 12,193,188 B2 * | 1/2025 | Lin | H05K 7/20327 |
| 12,193,197 B2 * | 1/2025 | Gao | H05K 7/20381 |
| 12,200,904 B2 * | 1/2025 | Lin | H05K 7/20272 |
| 2006/0007657 A1 | 1/2006 | Pfahnl et al. | |
| 2008/0104970 A1 * | 5/2008 | Suzuki | H01L 23/427 165/104.33 |
| 2011/0162829 A1 * | 7/2011 | Xiang | F28C 3/005 165/234 |
| 2014/0216688 A1 | 8/2014 | Shelnutt et al. | |
| 2016/0014934 A1 | 1/2016 | Shiraiwa et al. | |
| 2016/0209086 A1 | 7/2016 | Kraus et al. | |
| 2017/0280587 A1 | 9/2017 | Watanabe et al. | |
| 2017/0326489 A1 | 11/2017 | Lau et al. | |
| 2017/0342233 A1 | 11/2017 | Oliveira Juarez et al. | |
| 2018/0084670 A1 | 3/2018 | Hirai et al. | |
| 2018/0084671 A1 | 3/2018 | Matsumoto et al. | |
| 2018/0279507 A1 | 9/2018 | Midgley et al. | |
| 2019/0008077 A1 | 1/2019 | Ishinabe | |
| 2019/0357378 A1 | 11/2019 | Kolar et al. | |
| 2019/0357379 A1 | 11/2019 | Kolar | |
| 2019/0383559 A1 | 12/2019 | Aoki et al. | |
| 2021/0219454 A1 * | 7/2021 | Cheng | H05K 7/20318 |
| 2022/0232738 A1 * | 7/2022 | Tuma | H05K 7/20381 |
| 2023/0232585 A1 * | 7/2023 | Lau | H05K 7/20327 361/700 |
| 2023/0309271 A1 * | 9/2023 | Gao | H05K 7/20818 |
| 2024/0373596 A1 * | 11/2024 | Lau | H05K 7/20236 |

* cited by examiner

TWO-PHASE IMMERSION COOLING APPARATUS WITH ACTIVE VAPOR MANAGEMENT

CROSS-REFERENCE TO RELATED APPLICATIONS

Pursuant to 35 U.S.C. 120 and 365(c), this application is a continuation of International Application PCT/EP2021/055404, filed on Mar. 3, 2021, which designates the United States and claims priority to U.S. application Ser. No. 16/939,570, filed on Jul. 27, 2020, now U.S. Pat. No. 10,966,349, each of which is hereby incorporated by reference in its entirety.

FIELD

This disclosure relates to two-phase immersion cooling apparatuses and methods for cooling electronic devices.

BACKGROUND

Data centers house information technology (IT) equipment for the purposes of storing, processing, and disseminating data and applications. IT equipment may include electronic devices, such as servers, storage systems, power distribution units, routers, switches, and firewalls.

During use, IT equipment consumes electricity and produces heat as a byproduct. A data center containing thousands of servers requires a dedicated IT cooling system to manage the heat produced. The heat must be captured and rejected from the data center. If the heat is not removed, ambient temperature within the data center will rise above an acceptable threshold and temperature-induced performance throttling of electronic devices (e.g., microprocessors) may occur.

Data centers are energy-intensive facilities. It is not uncommon for a data center to consume over 50 times more energy per square foot than a typical commercial office building. Collectively, data centers account for about 3% of global electricity use.

Electricity use in data centers is attributable to a variety of systems, including IT equipment, air management systems, mechanical systems, electrical systems (e.g., power conditioning systems), and cooling systems for IT equipment. Examples of IT cooling systems include precision air conditioning systems, direct expansion systems, chilled water systems, free cooling systems, humidification systems, and direct liquid cooling systems. In some data centers, IT cooling and power conditioning systems account for over half of all electricity use.

Most data centers utilize precision air conditioning systems for IT cooling. Precision air conditioners employ a vapor-compression cycle, similar to residential air conditioners. Although air conditioning technology is well-suited for comfort-cooling office space, it is not well-suited for cooling thousands of relatively small, hot devices distributed throughout a large data center. Air has a relatively low heat capacity, which necessitates movement and conditioning of large amounts of air to cool IT equipment. Consequently, air conditioners suffer from poor thermodynamic efficiency, which translates to high operating expense. To reduce operating expense, there is a need to cool servers more efficiently.

SUMMARY OF THE INVENTION

Accordingly, advancements that improve efficiency, performance, reliability, and sustainability of IT cooling systems are needed.

In a first aspect, the invention relates to an immersion tank assembly. In some embodiments, the immersion tank assembly includes one or more immersion tank, each forming an interior volume, and a vapor management system fluidically connected to the immersion tank assembly. In some applications, each immersion tank may include an upper portion, a lower portion, and a primary condenser in thermal communication with the interior volume of the immersion tank and the vapor management system may include a condensing chamber forming an interior volume and including an inlet, an outlet, and an auxiliary condenser in thermal communication with the interior volume of the condensing chamber; a vapor supply passage fluidically connecting the upper portion of the immersion tank to the inlet of the condensing chamber; a valve disposed in the vapor supply passage between the upper portion of the immersion tank and the inlet of the condensing chamber; and a liquid return passage fluidically connecting the outlet of the condensing chamber to the immersion tank assembly.

In some implementations, the two-phase immersion cooling apparatus may also include one or more of the following: a variable volume chamber fluidically connected to the vapor supply passage and disposed between the upper portion of the immersion tank assembly and the inlet of the condensing chamber; a pressure relief valve fluidically connected to the condensing chamber; a sensor to detect pressure within the immersion tank assembly, the sensor located in the immersion tank assembly and/or in the vapor supply passage; an exhaust passage fluidically connected to the condensing chamber; a pressure relief valve fluidically connected in the exhaust passage; and a sensor to detect pressure within the vapor management system and located in the vapor management system; a water separator fluidically connected to the liquid return passage between the outlet of the condensing chamber and an inlet to the immersion tank assembly; a liquid pump fluidically connected to the liquid return passage and disposed between the outlet of the condensing chamber and an inlet to the immersion tank assembly; a drying filter fluidically connected to the liquid return passage and disposed between the outlet of the condensing chamber and an inlet to the immersion tank assembly; an impurity filter fluidically connected to the liquid return passage and disposed between the outlet of the condensing chamber and an inlet to the immersion tank assembly; and a vapor pump fluidically connected to the vapor supply passage and disposed between the upper portion of the immersion tank and the inlet of the condensing chamber.

In a second aspect, the invention relates to an immersion tank assembly. In some embodiments, the immersion tank assembly includes one or more immersion tank, each forming an interior volume, and a vapor management system fluidically connected to the immersion tank assembly. In some applications, each immersion tank may include an upper portion, a lower portion, and a primary condenser in thermal communication with the interior volume and the vapor management system may include: a condensing chamber forming an interior volume and comprising an inlet, an outlet, and an auxiliary condenser in thermal communication with the interior volume of the condensing chamber; a vapor supply passage fluidically connecting the upper portion of the immersion tank to the inlet of the condensing chamber; a valve disposed in the vapor supply passage between the upper portion of the immersion tank and the inlet of the condensing chamber; a liquid return passage fluidically connecting the outlet of the condensing chamber to an inlet to the immersion tank assembly; a sensor configured to detect pressure in the immersion tank assembly and to generate and transmit a signal based on a measured pressure; and an electronic control unit configured to receive the signal from the sensor and to send a command signal to the valve.

In some implementations, the sensor may be disposed in the immersion tank assembly and/or the vapor supply passage between the valve and the immersion tank assembly. In some variations, the condensing chamber may have a volume at least 10% as large as a headspace volume of the immersion tank. In some applications, the condenser chamber may also include a chiller fluidically connected to the auxiliary condenser. In some embodiments, the apparatus may also include a heat exchanger fluidically connected to the primary condenser.

In a third aspect, the invention relates to a method of immersion cooling a heat-producing device. In some embodiments, the method includes providing a two-phase immersion cooling apparatus; detecting a pressure within the immersion tank; at least one of: opening the valve when a measured pressure in the immersion tank assembly is greater than a predetermined threshold setting (e.g., between −0.9 psig and 0.9 psig), such that dielectric vapor and other gas from the immersion tank assembly are admitted into the condensing chamber; or closing the valve when the measured pressure in the immersion tank assembly is less than the predetermined threshold setting; condensing the dielectric vapor and other gas to a liquid state in the condensing chamber; and returning condensed dielectric liquid to the immersion tank assembly through the liquid return passage.

In some implementations, the provided immersion tank assembly may include one or more immersion tank, each forming an interior volume, and a vapor management system fluidically connected to the immersion tank assembly. In some applications, each immersion tank may include an upper portion, a lower portion, and a primary condenser in thermal communication with the interior volume of the immersion tank and the vapor management system may include a condensing chamber forming an interior volume and including an inlet, an outlet, and an auxiliary condenser in thermal communication with the interior volume of the condensing chamber; a vapor supply passage fluidically connecting the upper portion of the immersion tank to the inlet of the condensing chamber; a valve disposed in the vapor supply passage between the upper portion of the immersion tank and the inlet of the condensing chamber; and a liquid return passage fluidically connecting the outlet of the condensing chamber to the immersion tank assembly.

In some variations, the method may also include circulating a coolant through the primary condenser, the coolant having a temperature greater than or equal to an ambient air temperature and/or circulating a first coolant through the primary condenser and circulating a second coolant through the auxiliary condenser, wherein a temperature of the first coolant is greater than a temperature of the second coolant.

In some implementations, the method may also include providing a vapor pump fluidically connected to the vapor supply passage and disposed between the immersion tank assembly and the inlet of the condensing chamber and operating the vapor pump while the valve is open to purge gas from a headspace of the immersion tank and reduce pressure within the immersion tank below atmospheric pressure.

DETAILED DESCRIPTION

Figure 1:
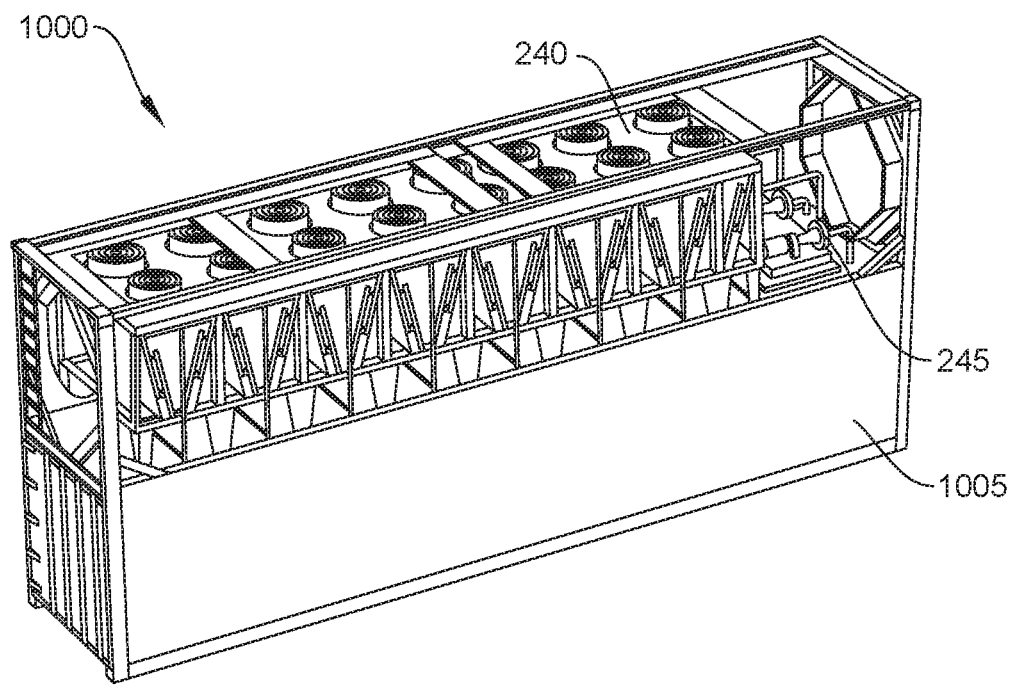
FIG. 1 shows a perspective view of a modular data center, in accordance with some embodiments of the present invention.

Direct liquid cooling systems present a promising alternative to air conditioning systems for data center applications. One form of direct liquid cooling is immersion cooling. In an immersion cooling system, an electronic device is immersed in dielectric fluid. Waste heat from the electronic device is transferred to the fluid and then rejected outside the data center. Since waste heat is not released into the ambient air of the data center, a precision air conditioning system is generally not needed.

Immersion cooling systems may employ single-phase or two-phase technology. In a single-phase immersion cooling system, electronic devices are immersed in a fluid, such as mineral oil. Waste heat from the electronic devices is transferred to and warms the fluid. The warmed fluid is pumped from the immersion cooling system to a heat rejection system, such as an evaporative cooling tower, dry cooler, or chilled water loop, that captures waste heat from the fluid and rejects the heat outside the data center.

A drawback of single-phase immersion cooling technology is that mineral oil can act as a solvent and, over time, remove identifying information from motherboards, processors, and other components. For instance, product labels (e.g., stickers containing serial numbers and bar codes) and other markings (e.g., screen printed information and model numbers on capacitors and other devices) may dissolve and wash off due to a continuous flow of mineral oil over device surfaces. As the labels and ink wash off the server, the mineral oil can become contaminated and may need to be replaced, resulting in expense and periodic downtime. Another drawback of single-phase immersion cooling is that servers cannot be serviced immediately after being withdrawn from the tank. Typically, the server must be removed from the tank and allowed to drip dry for several hours before servicing. During this drying period, the server may be exposed to contaminants in the circulating air, and the presence of mineral oil on the server may attract and trap contaminants (e.g., dust or particulates) on sensitive circuitry, which may increase risk of short-circuiting and failure.

In a two-phase immersion cooling system, an electronic device is immersed in a fluid, such as hydrofluoroether, in a tank. The fluid readily evaporates and leaves no residue, so two-phase systems do not suffer the drawbacks of single-phase mineral oil-based systems mentioned above. During use, waste heat from the electronic device is absorbed by the fluid, resulting in localized vaporization of the fluid. Vapor rises into a headspace of the tank and is condensed by a condenser. Heat from the vapor is transferred to coolant circulating through the condenser, thereby warming the coolant. The warmed coolant is then pumped from the condenser to a heat rejection system, such as an evaporative cooling tower, dry cooler, or chilled water loop, which captures the waste heat from the fluid and rejects the heat outside the data center.

Two-phase immersion cooling systems leverage the benefits of phase change heat transfer, which makes them more efficient at and capable of cooling electronic devices with high heat flux, such as high-performance computing (HPC) servers with multiple graphics processing units (GPUs), than single-phase immersion cooling systems. However, along with the benefits of phase change heat transfer comes a challenge. In practice, retaining vapor within the system has proven challenging in prior art two-phase systems. Over time, existing two-phase immersion cooling systems inevitably suffer fluid loss to the environment. The lost fluid may be costly to replenish on a recurring basis. Examples of prior art two-phase cooling systems and their modes of fluid loss and other shortcomings are described below.

Figure 15:
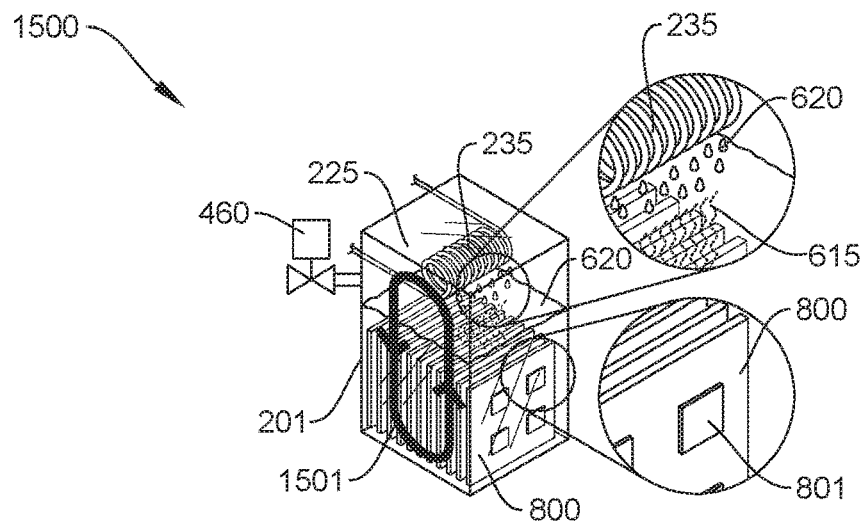
FIG. 15 shows a prior art immersion cooling system with a primary condenser.

FIG. 15 shows a prior art example of a basic two-phase immersion cooling apparatus 1500. The apparatus 1500 includes an immersion tank 201 partially filled with dielectric fluid 620 in liquid phase. The apparatus includes a condenser 235 mounted in a headspace of the tank 201. An electronic device 800 is immersed in the dielectric fluid. The electronic device may be a server including one or more microprocessors 801. The tank 201 is enclosed by a lid 225. When powered on and functioning, the electronic device 800 produces heat. The heat is transferred to the dielectric fluid 620, which causes a portion of the fluid to boil and dielectric vapor 615 to form. The vapor 615 rises through a bath of dielectric liquid 620 and enters the headspace of the tank 201. When vapor 615 contacts the condenser 235, it condenses to liquid and passively recirculates back to the liquid bath, thereby completing a cycle of evaporation, condensation, precipitation, and collection. During operation, boiling of the relatively dense dielectric fluid 620 produces a relatively less dense vapor 615, which expands and enters the headspace occupied by non-condensable gases. Dielectric fluid 620 occupies more volume as a vapor than liquid, so as more vapor 615 is produced and enters the headspace, tank pressure increases. To prevent the tank pressure from reaching an unsafe level, a pressure relief valve 460 is provided in the tank 201 and opened when the pressure exceeds a predetermined threshold. Upon actuation of the pressure relief valve 460, dielectric vapor 615 is released from the tank 201 and lost to the environment. Over time, periodic valve actuation and fluid loss depletes the fluid 620, necessitating replenishment.

In a variation of the example shown in FIG. 15, the two-phase immersion cooling apparatus 1500 can be configured to maintain a tank pressure near ambient pressure (e.g., 1 atm) at all times. Operating at or near atmospheric pressure may be desirable to minimize fluid losses caused by leakage or diffusion through system joints or materials, respectively. When heat load from the electronic device 800 increases, the rate of dielectric vapor production increases and pressure builds within the tank 201. To avoid pressure accumulation, the pressure relief valve 460 may be actuated whenever tank pressure rises above atmospheric pressure. During periods of intense computing, this may result in frequent venting of vapor 615 to the environment. During idle periods, the heat load from the device 800 will decrease, and the rate of vapor production will decrease or even cease. Any remaining vapor 615 is condensed by the condenser 235 and, subsequently, air in the headspace is further cooled by the condenser 235, resulting in the tank pressure dropping below ambient pressure. To alleviate negative pressure in the tank 201, the pressure relief valve 460 may open and allow ambient air to enter the tank 201. Over time, this cyclical gas exchange results in fluid loss.

In another variation of the example shown in FIG. 15, the two-phase immersion cooling apparatus 1500 can be equipped with a high-capacity condenser 235 having a cooling capacity that exceeds a maximum heat load of the electronic device 800. The condenser 235 may operate at a temperature significantly below the vapor temperature of the dielectric fluid 620, thereby ensuring that vapor 615 is promptly condensed, thereby avoiding over-pressurization due to vapor accumulation. Although this approach reduces fluid loss, the condenser 235 is large and energy-inefficient, making it costly and impractical for large-scale data center applications.

In another variation of the example shown in FIG. 15, the two-phase immersion cooling apparatus 1500 can be hermetically sealed. The tank 201 can be a pressure vessel, capable of withstanding high positive or negative pressures without risk of failure. Unfortunately, pressure vessels are costly to construct and maintain. For the sake of product liability, the effect of high-pressure operation on unique server models would require evaluation and approval before use, resulting in ongoing validation and liability burdens. High operating pressures may promote diffusion losses of fluid and accelerate aging of gaskets and other system components. In a sealed system, routine server maintenance requires shutting down the cooling system and unsealing the lid to access to the servers, which is time-consuming. For these reasons, a hermetically-sealed tank 201 is not a practical option for most data centers, especially those with high up-time requirements.

Figure 16:
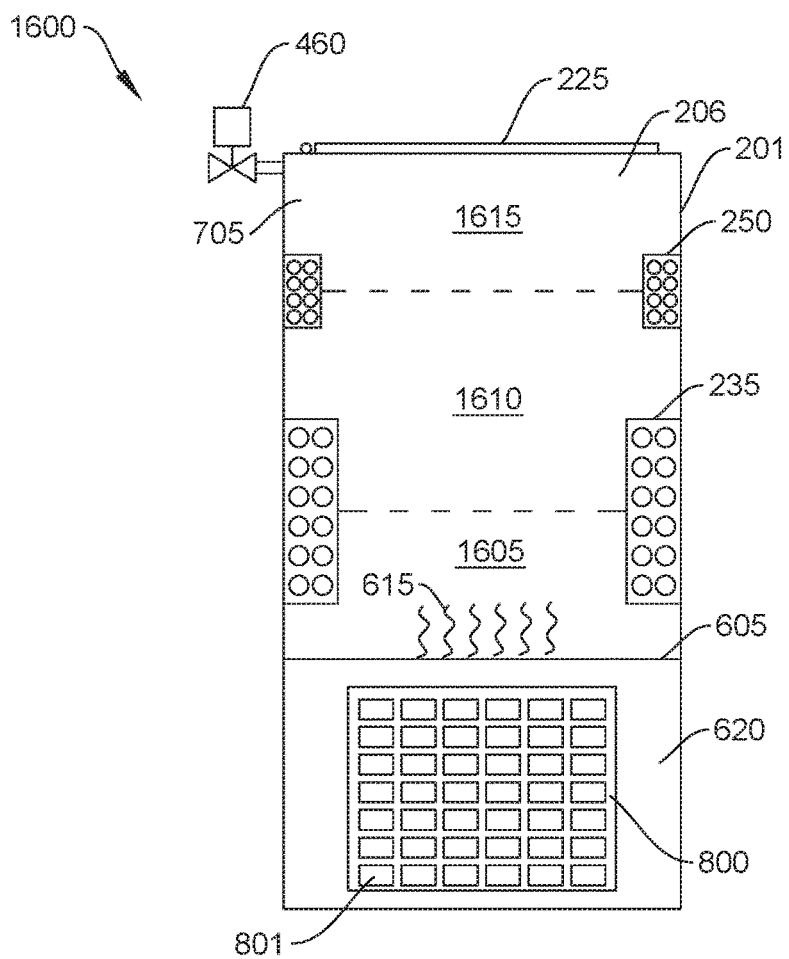
FIG. 16 shows a prior art immersion cooling system with a primary condenser and a freeboard condenser.

FIG. 16 shows a second prior art example of a two-phase immersion cooling apparatus 1600. The apparatus 1600 includes an immersion tank 201 partially filled with dielectric fluid 620 in liquid phase. An electronic device 800 is immersed in the dielectric fluid 620. The electronic device 800 may be a server including one or more microprocessors 801. The immersion tank 201 is enclosed by a lid 225. The apparatus 1600 can include two condensers. For example, the apparatus 1600 may include a primary condenser 235 and a freeboard condenser 250 mounted within the immersion tank 201. The primary condenser 235 may be located above a liquid line 605 in the headspace of the tank 201. The freeboard condenser 250 may be located a distance above the primary condenser 235 in the headspace 206. In one example, the primary condenser 235 may operate at a temperature of about 5° C. to 15° C. The freeboard condenser 250 may operate at a lower temperature of about −28° C. to −2° C. The apparatus 1600 has a high freeboard ratio, where freeboard ratio is defined as a distance measured from the top of the primary condenser 235 to an underside of the lid 225 divided by an internal width of the immersion tank 201.

During steady-state operation of the apparatus 1600, vapor 615 is generated as heat from the electronic device 800 vaporizes fluid 620 in the tank 201. The vapor 615 is heavier than air 705, so a first zone 1605 containing saturated vapor 615 may settle above the liquid line 605. A second zone 1610 containing mixed vapor 615 and air 705 may form above the saturated vapor 615. A third zone 1615 containing mostly air 705 may form above the mixture of vapor 615 and air 705. The saturated vapor zone 1605 may be located between the liquid line 605 and the primary condenser 235. The mixed vapor and air zone 1610 may be located between the primary condenser 235 and the freeboard condenser 250. The third zone 1615 containing mostly air 705 may be located between the freeboard condenser 250 and the lid 225. The primary condenser 235 may be appropriately sized to condense most of the vapor 615 produced during steady-state operation. The freeboard condenser 250 may condense vapor 615 that rises above the primary condenser 235 and enters the second zone 1610. During steady-state operation, an equilibrium of vapor production and condensing may exist.

During periods of high microprocessor 801 utilization, more electric power is consumed by the device 800 and more heat is produced, resulting in a higher rate of vapor production. As the amount of vapor 615 in the headspace 206 increases, the depth of the saturated vapor zone 1605 grows. The freeboard condenser 250, which is maintained at a much lower temperature than the primary condenser 235, may effectively condense vapor 615 that reaches it.

Although effective, the apparatus 1600 in FIG. 16 has certain drawbacks. First, the apparatus 1600 is inefficient, since the freeboard condenser 250 requires a chiller to operate continuously to maintain a suitably cold temperature. Second, the apparatus 1600 is not compact or user-friendly. To be effective, the apparatus 1600 must have a high freeboard ratio, which necessitates a relatively tall tank 201. While a tall tank 201 may be acceptable in a conventional data center with a high ceiling and access to a hoist or ladder to insert and remove electronic equipment to and from the tank 201, it is not suitable for a compact application, such as an edge or mobile data center application, where the system 1600 is installed in a confined space (e.g., shipping container 1005 (FIGS. 1 and 2) or utility enclosure) with height restrictions and minimal overhead clearance. In addition to these practical limitations, the cooling system 1600 in FIG. 16 may also suffer from fluid loss through similar modes as the cooling system 1500 shown in FIG. 15 and described above.

In view of the foregoing examples, it is desirable to provide a two-phase immersion cooling apparatus that is compact, energy-efficient, inexpensive, and experiences minimal fluid loss to the environment.

Two-Phase Immersion Cooling Apparatus with Active Vapor Management

Figure 4:
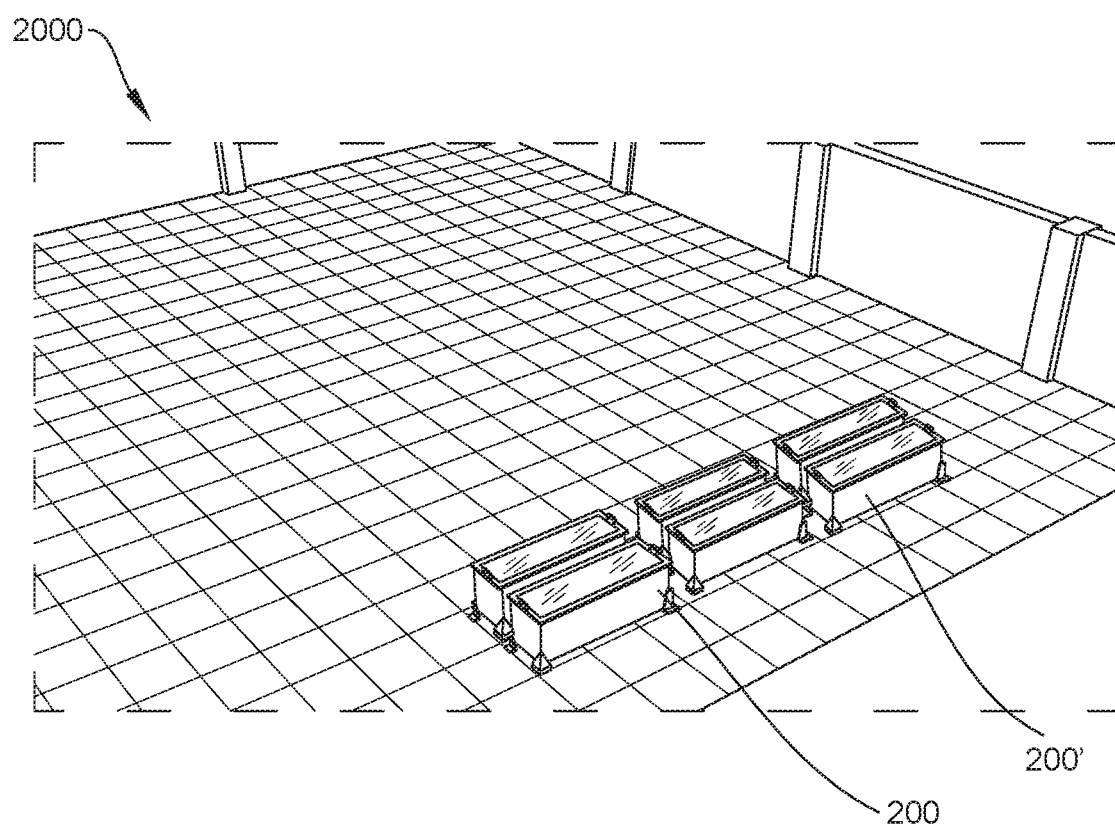
FIG. 4 shows a perspective view of a plurality of immersion cooling tank assemblies positioned in a conventional data center, in accordance with some embodiments of the present invention.
Figure 5:
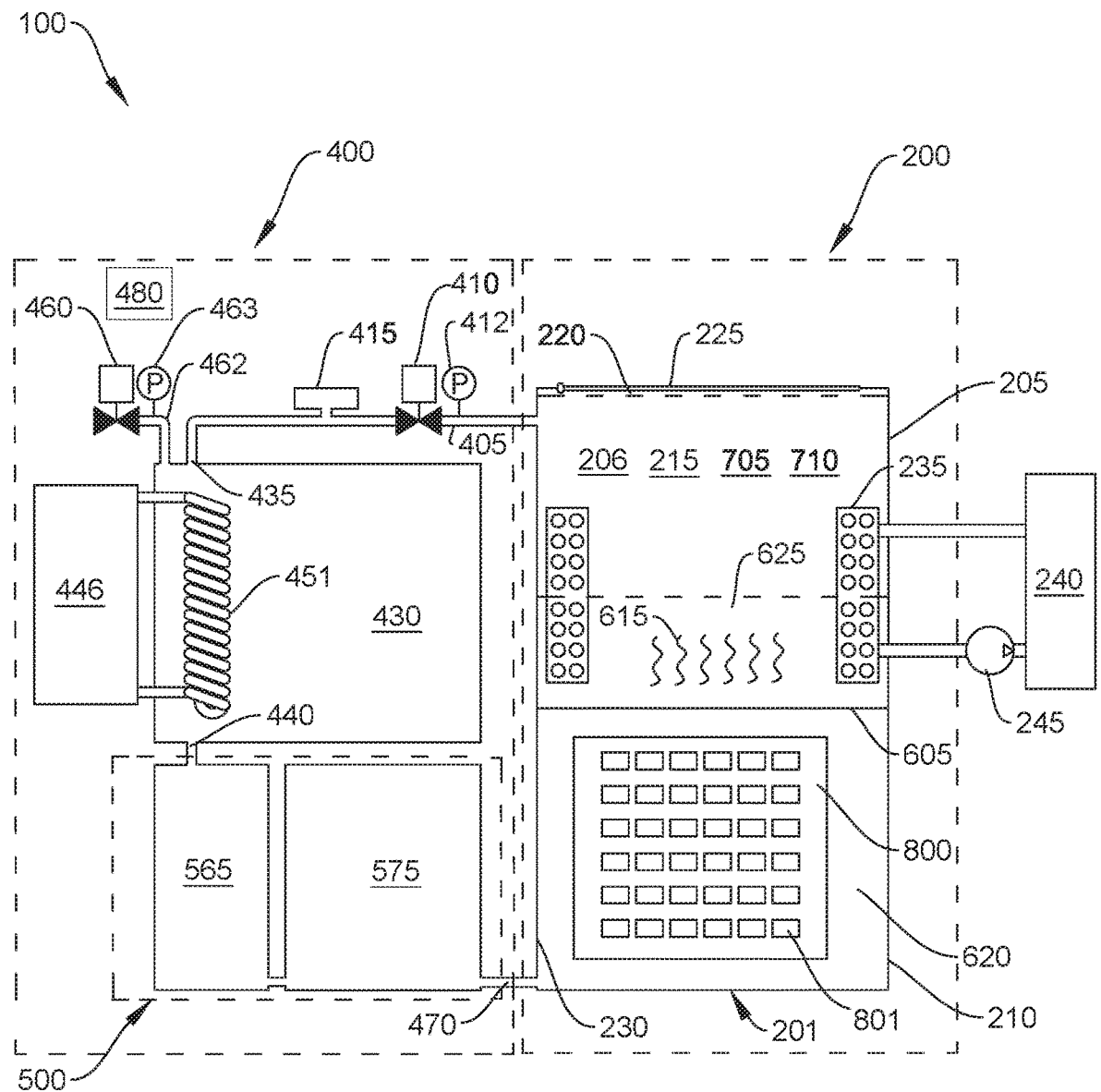
FIG. 5 shows a schematic diagram of a two-phase immersion cooling apparatus with a vapor management system, in accordance with some embodiments of the present invention.

FIG. 5 shows an embodiment of a two-phase immersion cooling apparatus 100 with active vapor management in accordance with certain embodiments of the invention. The two-phase immersion cooling apparatus 100 may be used in a variety of applications, ranging from a modular data center 1000, as shown in FIG. 1, to a traditional data center 2000, as shown in FIG. 4. In the embodiment of FIG. 1, the immersion cooling apparatus 100 may be positioned within a container 1005 (FIGS. 1 and 2) and fluidically connected to an external heat rejection system 240 mounted atop the container 1005.

Figure 3:
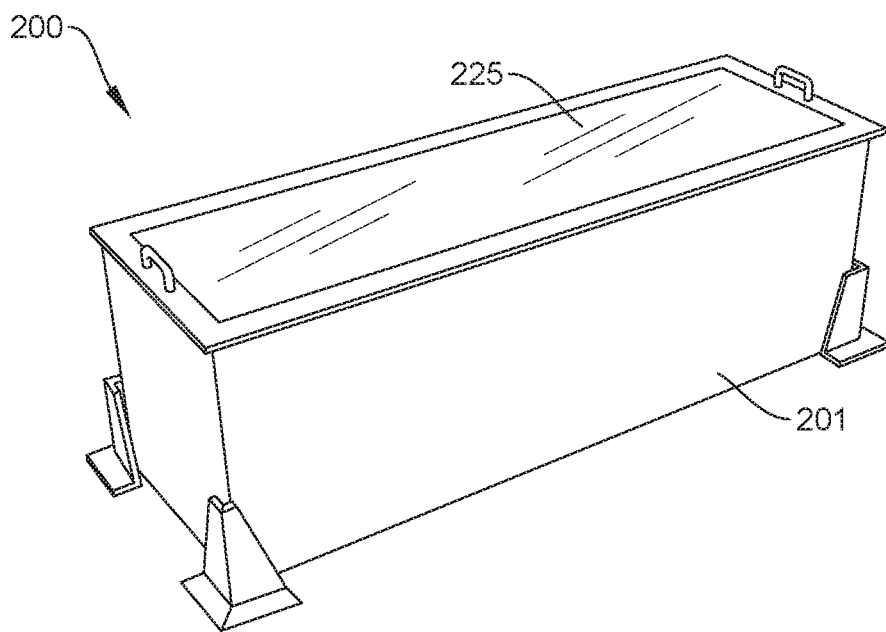
FIG. 3 shows a perspective view of an immersion cooling tank assembly, in accordance with some embodiments of the present invention.

The apparatus 100 may include an immersion tank assembly 200. The immersion tank assembly 200 may include an immersion tank 201 that is selectively sealable with a lid 225 (FIG. 3). The immersion tank 201 may be vertically compact, allowing it to be placed in confined spaces, such as shipping containers 1005 or utility enclosures associated with modular or edge data center applications. The immersion tank 201 may have a height that is less than a length or width of the tank 201. The immersion tank 201 may have a height that is less than a length and less than a width of the tank 201.

The immersion tank 201 may have an upper portion 205 and a lower portion 210. The upper portion 205 may be a portion of the immersion tank 201 that is located above the liquid line 605. The lower portion 210 may be a portion of the immersion tank 201 that is located below the liquid line 605. The liquid line 605 may be an interface formed between gases (e.g., air and dielectric vapor) in the headspace and dielectric liquid 620 in the lower portion 210 of the immersion tank 201. The immersion tank 201 may have an opening 220 in the upper portion 205. The tank 201 may have an electrical insulating layer 230 on an interior surface. The immersion tank may have a lid 225. When open, the lid 225 may provide access to an interior volume 215 of the immersion tank 201 to facilitate insertion and removal of electronic devices 800 (e.g., servers, switches, or power electronics). When closed, the lid 225 may enclose the opening 220 and prevent vapor loss. The lid 225 may (e.g., hermetically-) seal the opening 220.

The immersion tank 201 may be partially filled with (e.g., dielectric) fluid 620. The fluid 620 may be selected, or formulated by mixing two or more fluids, to have a boiling point that is less than an operating temperature of a heat-generating electronic device 800, such as a microprocessor 801. When the electronic device 800 is operating, fluid 620 in contact with the device 800 may boil locally and produce vapor 615. Vapor 615 may rise through the fluid bath and into the headspace 206 of the immersion tank 201. The vapor 615 may settle atop the liquid line 605, forming a blanket of saturated vapor 625.

The immersion tank assembly 200 may include a primary condenser 235. The primary condenser 235 may be located in the headspace 206 of the tank 201. The primary condenser 235 may condense vapor 615 within the immersion tank 201. In some implementations, the primary condenser 235 may be a cooling coil and, more specifically, a cooling coil that receives coolant, such as chilled water, water-glycol mixture, refrigerant, and the like from a heat rejection system 240, such as an evaporative cooling tower, dry cooler, or chilled water loop. The heat rejection system 240 may include a coolant pump 245, as shown in FIGS. 1 and 5. The coolant pump 245 may circulate coolant through the primary condenser 235 and heat rejection system 240.

To minimize energy consumption, the primary condenser 235 may operate at a temperature at or slightly above room temperature. In one embodiment, the primary condenser 235 may receive and circulate coolant at a temperature of about 33° C. when ambient temperature is 30° C. In another embodiment, the primary condenser 235 may receive and circulate coolant at a temperature of about 25° C. to 40° C. In yet another embodiment, the primary condenser 235 may receive and circulate coolant at a temperature of about 30° C. to 36° C. In still another embodiment, the primary condenser 235 may receive and circulate coolant at a temperature of about 0 to 10 degrees above an ambient air temperature. In still another embodiment, the primary condenser 235 may receive and circulate coolant at a temperature of about 0 to 15 degrees above an ambient air temperature.

The apparatus 100 may include a vapor management system 400. The vapor management system 400 may be fluidically connected to the immersion tank 201. The vapor management system 400 may receive vapor 615 from the immersion tank 201 when necessary to avoid over-pressurization of the tank 201, condense the vapor 615 to liquid 620, and return the liquid 620 to the immersion tank 201 for reuse. The vapor management system 400 may be located at least partially outside the headspace 206 of the immersion tank 201.

The vapor management system 400 may be an auxiliary vapor management system, for example, an external vapor management system. The vapor management system 400 may activate during periods of high, variable, or sustained vapor production. The vapor management system 400 may be activated or deactivated based on one or more system variables (e.g., tank pressure, tank temperature, or device power). The vapor management system 400 may provide surplus condensing capacity to manage periods of increased heat load and vapor production, thereby supplementing the condensing capacity of the primary condenser 235 when needed.

The vapor management system 400 may be actively controlled based on conditions measured or determined in the apparatus 100. For embodiment, the vapor management system 400 may be controlled based on an input of one or more variables, such as pressure, temperature, device power, vapor concentration, or opacity within the immersion tank 201. A variable may be measured with an electronic sensor, mechanically detected, estimated based on a correlated variable, or determined through any other suitable technique and combinations thereof.

The vapor management system 400 may include a vapor supply passage 405. The vapor supply passage 405 may fluidically connect the vapor management system 400 to the upper portion 205 of the immersion tank 201. The vapor supply passage 405 may be any suitable type of fluid passage, such as, for example, a tube, pipe, integrally-formed passage, or combinations thereof.

The vapor management system 400 may include a liquid return passage 470. The liquid return passage 470 may fluidically connect the vapor management system 400 to the lower portion 210 of the immersion tank 201. The liquid return passage 470 may be any suitable type of fluid passage, such as a tube, pipe, or integrally-formed passage, and combinations thereof. Together, the vapor supply passage 405 and liquid return passage 470 may enable circulation of fluid from and to the immersion tank 201. For example, the vapor management system 400 may receive dielectric vapor 615 from the immersion tank 201 and return liquid dielectric fluid 620 to the immersion tank 201.

The vapor management system 400 may include a valve 410 in the vapor supply passage 405. The (e.g., flow control) valve 410 may control flow of vapor through the vapor supply passage 405. When open, the valve 410 may permit vapor flow through the vapor supply passage 405 and from the immersion tank 201 to the vapor management system 400. The valve 410 may be a manual or automatic valve. The valve 410 may have a threshold (e.g., fixed or variable) pressure setting. In one embodiment, the threshold pressure setting may be about 0.15 psig. In this embodiment, when pressure in the immersion tank is greater than or equal to 0.15 psig, the valve 410 will open. The valve 410 may remain open until the vapor pressure in the immersion tank 201 drops below 0.15 psig, at which time the valve 410 may close. In another embodiment, the threshold pressure setting may be at or between −0.15 psig and 0.15 psig. In another embodiment, the threshold pressure setting may be at or between −0.25 psig and 0.25 psig. In another embodiment, the threshold pressure setting may be at or between −0.9 psig and 0.9 psig. In another embodiment, the threshold pressure setting may be at or between 0 psig and 0.25 psig. In another embodiment, the threshold pressure setting may be at or between −0.25 psig and 0 psig. In another embodiment, the threshold pressure setting may be at or between 1 psig and 5 psig. In another embodiment, the threshold pressure setting may be at or between 4 psig and 10 psig. In another embodiment, the threshold pressure setting may be at or between −1 psig and −5 psig. In another embodiment, the threshold pressure setting may be at or between −4 psig and −10 psig.

In some embodiments, the threshold pressure setting may be variable instead of fixed. A variable pressure setting may be useful in addressing an anticipated surge in vapor production during transient operation. For example, when device power consumption increases rapidly, a time lag may occur before a rise in vapor pressure is detected through pressure monitoring. The rise in vapor production may be accurately predicted by monitoring device power consumption. Upon detecting an increase in device power consumption, the threshold setting may be temporarily reduced to activate the vapor management system 400 sooner than if a fixed threshold setting were used.

In some applications, the vapor management system 400 may include a condensing chamber 430. The condensing chamber may be a fixed volume condensing chamber. The condensing chamber 430 may have an interior volume disposed between an inlet 435 and an outlet 440. The vapor supply passage 405 may fluidically connect to the inlet 435 of the condensing chamber 430. The vapor supply passage 405 may fluidically connect an outlet of the valve 410 to the inlet 435 of the condensing chamber 430. The vapor supply passage 405 may transport vapor 615 from the immersion tank 201 to the condensing chamber 430 when the valve 410 is open. The condensing chamber 430 may have a volume at least 10% as large as the headspace volume of the immersion tank 201. The condensing chamber 430 may have a volume at least 30% as large as the headspace volume of the immersion tank 201. The condensing chamber 430 may have a volume that is at least 50% as large as the headspace volume of the immersion tank 201. The condensing chamber 430 may have a volume that is at least 70% as large as the headspace volume of the immersion tank 201. Headspace volume may be a volume measured between the liquid line 605 and interior surface of the lid 225 and bounded by the sidewalls of the immersion tank 201.

The condensing chamber 430 may include an auxiliary condenser 451. The auxiliary condenser 451 may be in thermal communication with the condensing chamber 430. The auxiliary condenser 451 may extract heat from vapor 615 and condense the vapor 615 in the condensing chamber 430. The auxiliary condenser 451 may extend into an interior volume of the condensing chamber 430 or be in contact with at least one surface of the condensing chamber 430. The auxiliary condenser 451 may operate at a lower temperature than the primary condenser 235. In one embodiment, the auxiliary condenser 451 may include a cooling coil connected to a liquid chiller 446. The liquid chiller 446 may circulate chilled coolant through the auxiliary condenser 451. In one embodiment, the liquid chiller 446 may circulate liquid at a temperature of about 5 to 15 degrees C. In another embodiment, the liquid chiller 446 may circulate liquid at a temperature of about −2 to 10 degrees C. In another embodiment, the liquid chiller 446 may circulate liquid at a temperature of about −10 to −5 degrees C. In another embodiment, the liquid chiller 446 may circulate liquid at a temperature of about −28 to −2 degrees C.

Figure 12:
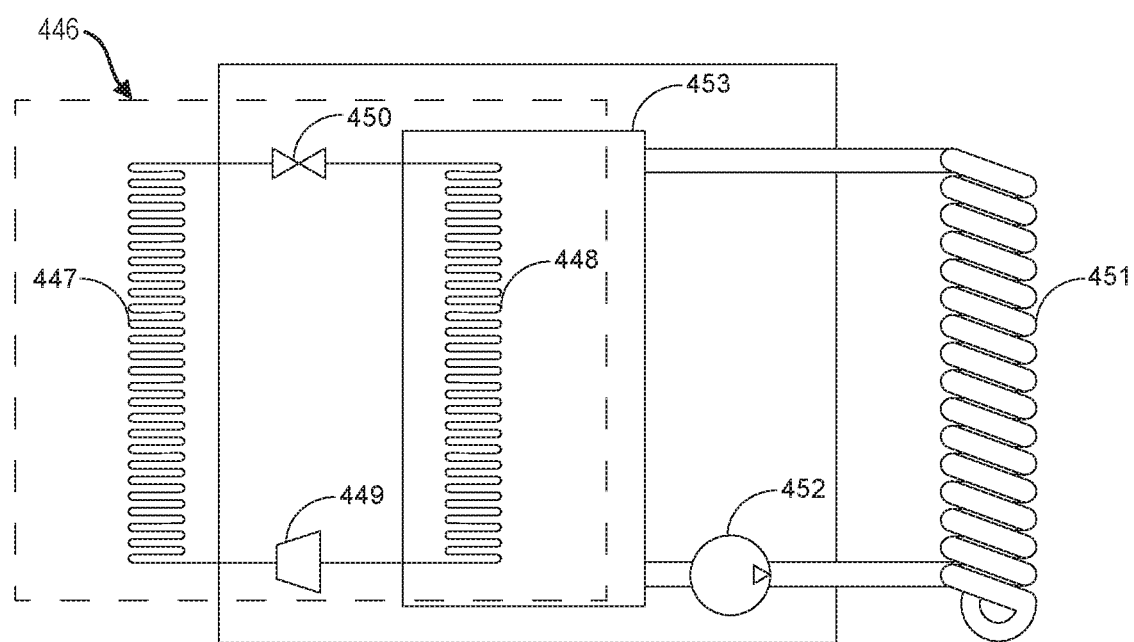
FIG. 12 shows a chiller and auxiliary condenser, in accordance with some embodiments of the present invention.

In one variation, the liquid chiller 446 may be a refrigeration system, as shown in FIG. 12. The chiller 446 may include a pump 452 that circulates fluid between a reservoir 453 and a cooling coil 451 to maintain the cooling coil at a temperature ($T_c$) that is less than the ambient temperature. The fluid may be a dielectric fluid. The fluid may be the same type of fluid used in the immersion tank 201 to reduce risk of cross-contamination from leakage or diffusion. Using the same type of fluid may also simplify maintenance tasks. The liquid chiller 446 may include a compressor 449, a condenser 447, an expansion valve 450, and an evaporator 448. The liquid chiller 446 may employ a refrigeration cycle to extract heat from the fluid in the reservoir 453 and reject heat through the condenser 447.

The vapor management system 400 may include a variable volume chamber 415 (e.g., a bellows). The variable volume chamber 415 may be made of a vapor-resistant material, such as a metalized polyester film (e.g., mylar), with an expandable interior volume. The variable volume chamber 415 may be deflated when the pressure in the vapor management system 400 is less than or equal to 1 atm. The variable volume chamber 415 may inflate when pressure within the vapor management system 400 is greater than 1 atm. The variable volume chamber 415 may allow the total volume of the vapor management system 400 to expand to increase total vapor capacity, thereby allowing the system 400 to receive more vapor 615 during transient periods. Expansion of the variable volume chamber 415 may reduce pressure of incoming vapor 615 and promote condensing of the vapor 615.

The vapor management system 400 may include a pressure relief valve 460. The pressure relief valve 460 may be a safety device. The pressure relief valve 460 may open at a predetermined pressure threshold to prevent over-pressurization of the vapor management system 400. The pressure relief valve 460 may be fluidically connected to the condensing chamber 430 via an exhaust passage 462. In one embodiment, the pressure relief valve 460 may be configured to open when pressure within the vapor management system 400 is equal to or greater than about 0.15 psig. In another embodiment, the pressure relief valve 460 may be configured to open when pressure within the vapor management system 400 is equal to or greater than about 0.20 psig. In yet another embodiment, the pressure relief valve 460 may be configured to open when pressure within the vapor management system 400 is equal to or greater than about 0.25 psig.

Figure 13:
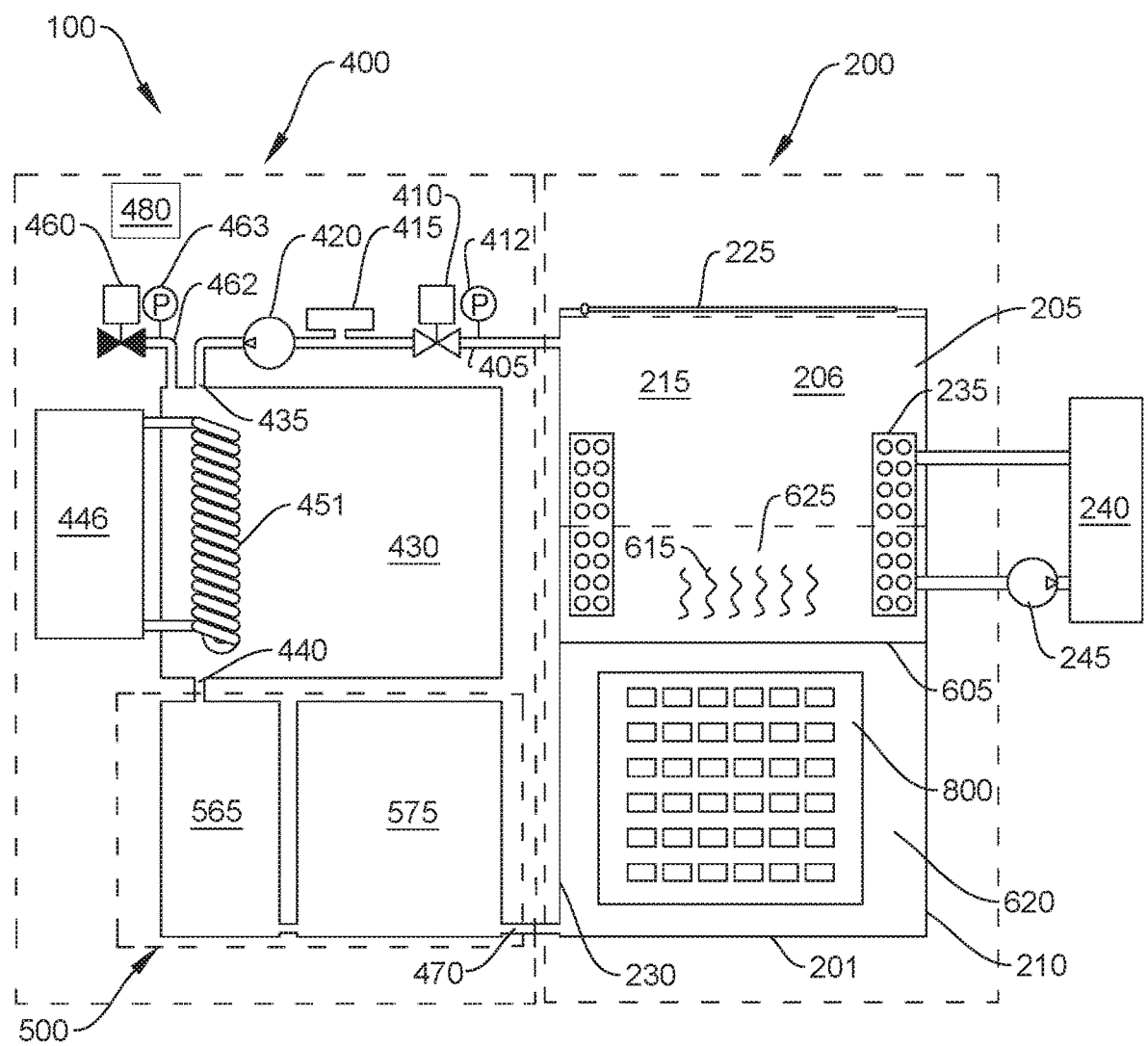
FIG. 13 shows the apparatus of FIG. 5 with a vapor pump included in the vapor management system, in accordance with some embodiments of the present invention.

The vapor management system 400 may include a vapor pump 420, as shown in FIG. 13. The vapor pump 420 may be configured to purge a mixture of air and dielectric vapor 615 from the immersion tank 201 to the condensing chamber 430. The vapor pump 420 may be located upstream of the condensing chamber 430. The vapor pump 420 may have an inlet and an outlet. The inlet of the vapor pump 420 may be fluidically connected to the outlet of the variable volume chamber 415. The outlet of the vapor pump 420 may be fluidically connected to the inlet 435 of the condensing chamber 430. The vapor pump 420 may be capable of reducing the pressure in the immersion tank 201 below atmospheric pressure. The vapor pump 420 may overcome gravitational effects on fluid flow and allow the vapor management system 400 to be positioned irrespective of height or orientation relative to the headspace 206, thereby providing greater design freedom that may be needed when packaging the vapor management system 400 in a confined space, such as a container 1005 (FIGS. 1 and 2) or utility box.

The vapor pump 420 may be useful for preemptively addressing periods of anticipated elevated vapor production. In one embodiment, upon detecting an increase in device power consumption that will result in elevated vapor production, the valve 410 may be opened and the vapor pump 420 may be activated to purge vapor 615 from the headspace 206, thereby drawing down vapor pressure within the tank 201 ahead of an anticipated pressure rise. This approach may diminish a pressure rise rate within the immersion tank 201 resulting from increased power consumption and vapor production.

The vapor management system 400 may be electronically controlled. The vapor management system 400 may include an electronic control unit 480. The electronic control unit 480 can be configured to open or close the flow control valve 410 based on a signal received from a sensor 412 or other input signal. For example, the electronic control unit 480 may receive an input signal (e.g., a pressure signal) from the sensor 412 and, based on the input signal, send a command signal to the flow control (e.g., solenoid) valve 410 to open or close. The sensor 412 can be a pressure sensor configured to measure pressure in the immersion tank 201. The sensor 412 can be configured to transmit a signal to the electronic control unit 480 corresponding to pressure in the immersion tank 201. The signal can be transmitted through a wired or wireless connection.

The electronic control unit 480 can be configured to open or close the pressure relief valve 460 based on a signal received from a sensor or other input. The sensor 463 can be a pressure sensor configured to measure pressure in the vapor management system 400. The sensor 463 can be configured to transmit a signal to the electronic control unit 480 corresponding to pressure in the vapor management system 400. The signal can be transmitted through a wired or wireless connection.

Figure 14:
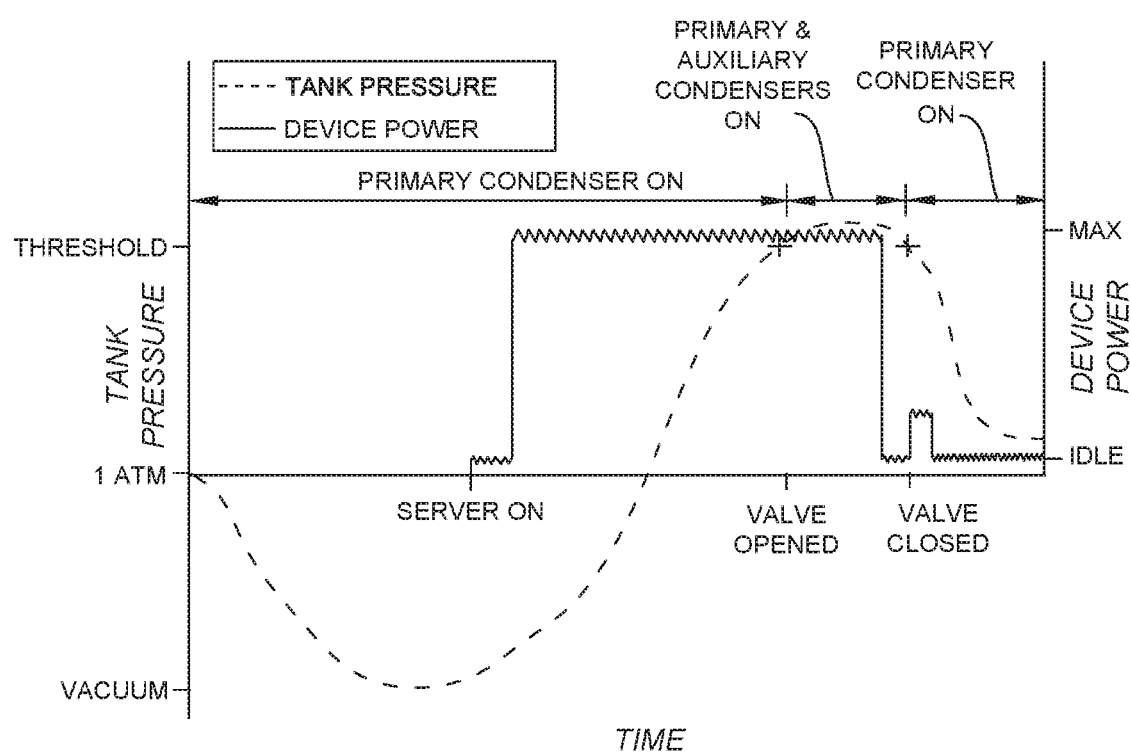
FIG. 14 shows a plot of immersion tank pressure and electronic device power consumption versus time when tank pressure is drawn below atmospheric pressure prior to powering on the electronic device, in accordance with some embodiments of the present invention.

The electronic control unit 480 can be configured to activate or deactivate the vapor pump 420 (FIG. 13) based on a signal received from the (e.g., pressure) sensor 412. For instance, in the embodiment plotted in FIG. 14, the electronic control unit 480 may activate the vapor pump 420 and purge vapor 615 from the headspace 206 to reduce tank pressure below atmospheric pressure prior to initiating a cooling cycle. Reducing pressure within the immersion tank 201 may reduce the boiling temperature of the fluid 620, which may be desirable in certain applications. In the embodiment of FIG. 14, tank pressure is drawn down below atmospheric pressure and the threshold pressure setting of the valve 410 is set above atmospheric pressure, thereby allowing the operating pressure of the tank 201 to oscillate in a range that includes values above and below atmospheric pressure. This method may minimize the extent and duration of tank pressure deviations away from atmospheric pressure, thereby minimizing fluid loss due to pressure-induced diffusion or leakage. In another embodiment, tank pressure may be drawn down below atmospheric pressure and the threshold pressure setting of the valve 410 may be set below atmospheric pressure, thereby allowing the operating pressure of the tank 201 to oscillate in a negative pressure range. This method may be desirable to reduce the boiling temperature of the fluid 620.

Figure 10:
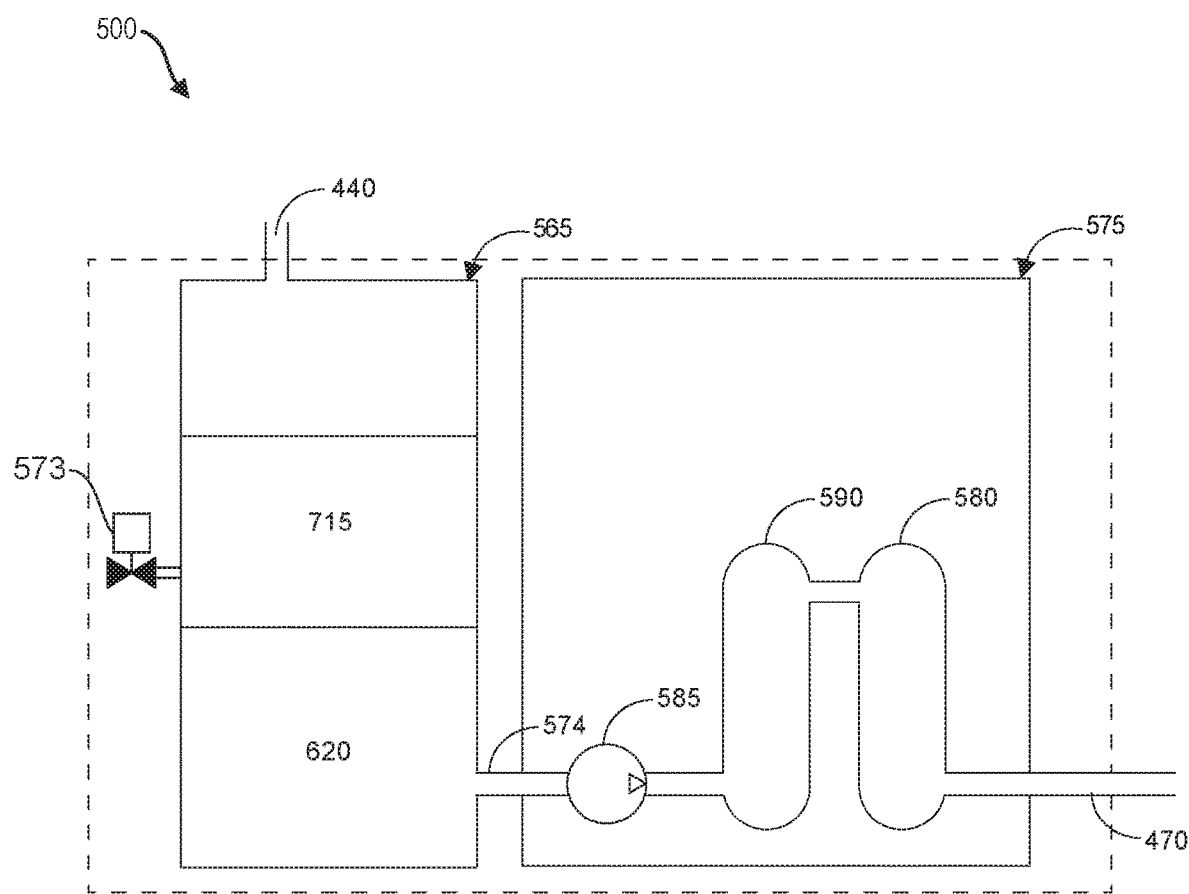
FIG. 10 shows a gravity-based water separator and filtration assembly, in accordance with some embodiments of the present invention.
Figure 11:
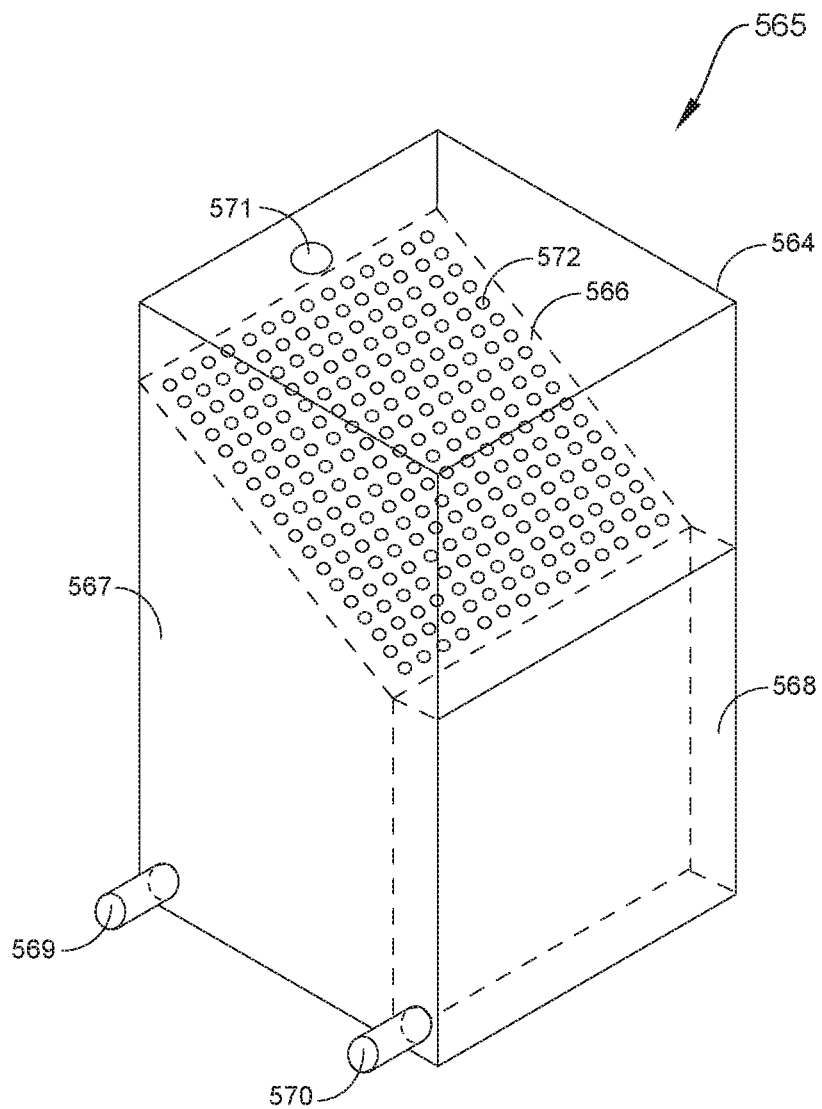
FIG. 11 shows an alternate embodiment of a water separator, in accordance with some embodiments of the present invention.

In some embodiments, the apparatus 100 may include a water separation and filtration system 500 (FIG. 5). As shown in FIGS. 5, 10, and 11, the water separation and filtration system 500 may include an assembly of one or more of the following components: a water separator 565 and a filtration system 575 that may include—for the purpose of illustration rather than limitation—a liquid pump 585, a drying filter 590, an impurity filter 580, and the like.

For example, referring to FIG. 10, in some embodiments, the apparatus 100 may include a water separator 565. The water separator 565 may include an inlet 440 and an outlet 574. The water separator 565 may receive condensed liquid from the condensing chamber 430. The water separator 565 may be configured to separate water 715 or other undesirable fluids from dielectric fluid 620. The water separator 565 may capture water 715 or other undesirable fluids and allow dielectric fluid 620 to pass through. Water 715 or other undesirable fluids accumulated in the water separator 565 may be drained periodically. The amount of accumulated water 715 or other undesirable fluids may depend on ambient air humidity, how well the apparatus is sealed, and how frequently the lid 225 of the immersion tank 201 is opened.

In one embodiment, the water separator 565 may be a gravity-based water separator. Water 715 or other undesirable fluids may be less dense than the dielectric liquid 620. Consequently, captured water 715 or other undesirable fluids may settle atop the dielectric liquid 620 within the water separator 565. The water 715 or other undesirable fluids may be purged from the water separator 565 periodically through a drain valve 573. Dewatered dielectric liquid 620 may occupy the lower portion of the water separator 565. Dewatered dielectric liquid 620 may be drawn from the water separator 565 through the outlet 574 located in the lower portion of the water separator 565.

Figure 23:
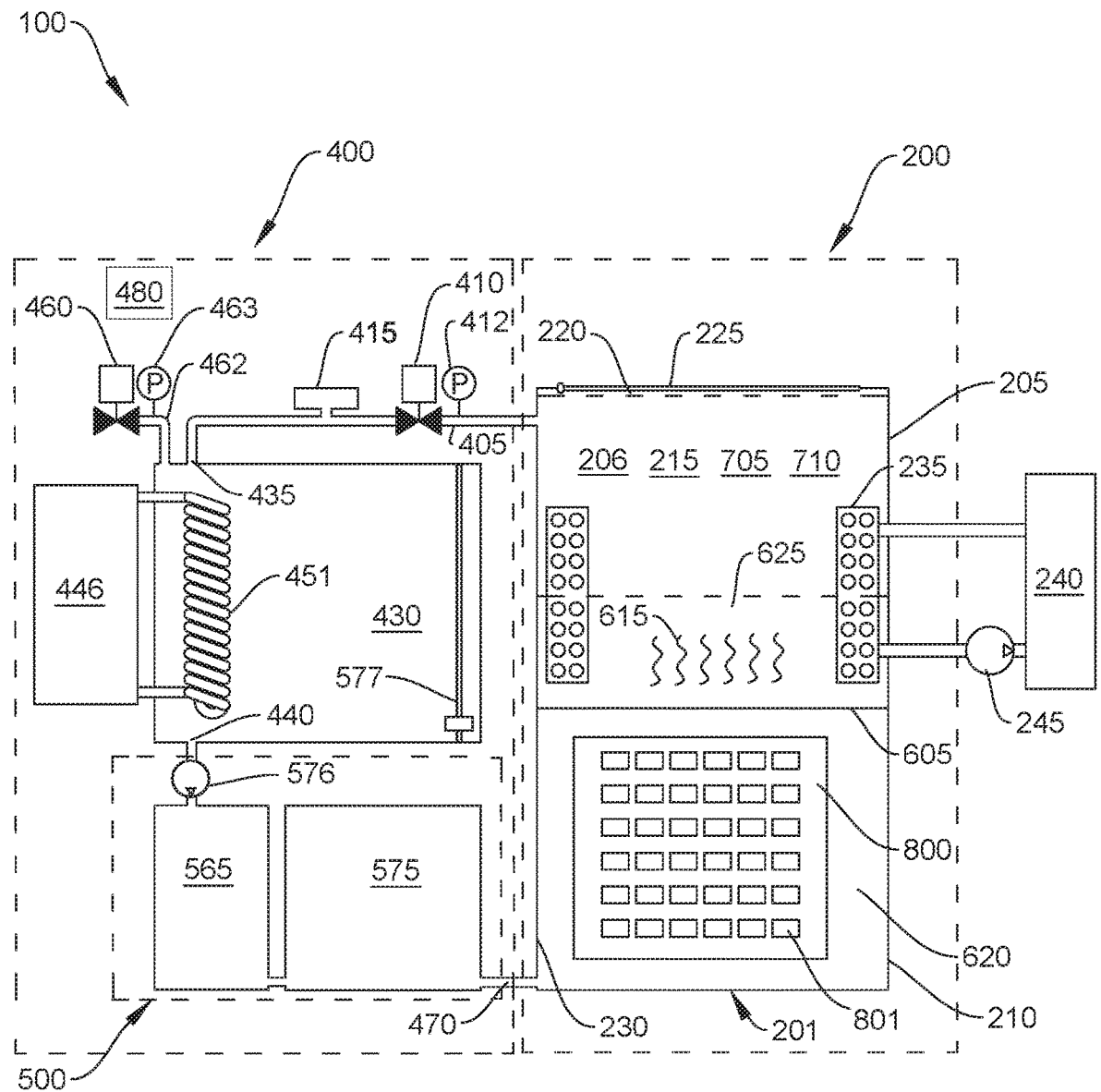
FIG. 23 shows the apparatus of FIG. 5 with a liquid level sensor included in the vapor management system and a liquid pump included in the water separator and filtration assembly, in accordance with some embodiments of the present invention.

In an alternate embodiment, the water separator 565 may be a pump-based water separator. As shown in FIG. 23, the auxiliary condenser 451 may extract heat from vapor 615 and water vapor 710 and condense the vapor 615 and water vapor 710 in the condensing chamber 430. A liquid pump 576 may be fluidically coupled between the condensing chamber 430 and the water separator 565. The condensate resulted from condensing vapor 615 and water vapor 710 may then be accumulated in the venting chamber, raising the liquid level in the condensing chamber 430. A liquid level sensor 577 operatively disposed in the condensing chamber 430 may be configured to measure the liquid level. If the measured liquid level exceeds a preferred liquid level, a control device may be adapted to trigger the liquid pump 576, so that all or some portion of the liquid in the condensing chamber 430 will be pumped into the water separator 565. One advantage of this alternative embodiment is that with a pump 576, the water separator 565 no longer needs to be placed at a location with sufficient gravitational potential difference with the condensing chamber 430.

In yet another embodiment, the water separator 565 may include a tilted perforated plate 566 in a container 564, as shown in FIG. 11. The container 564 may be structured and arranged to include an inlet 571, a dielectric fluid chamber 567, a dielectric fluid drain 569, a water chamber 568, and a water drain 570. In some implementations, the water separator 565 may be configured to separate dielectric fluid 620 from water 715 based on properties of the liquids, such as differing surface tensions. For example, HFE-7100 has a typical surface tension of 13.6 dynes/cm, while water has a typical surface tension of 72 dynes/cm. As a result, the dielectric fluid and water mixture may flow across the tilted perforated plate 566, but due to surface tension differences, the dielectric fluid 620 with a lower surface tension will flow through the perforations or holes 572 into the fluid chamber 567 beneath the tilted perforated plate 566 while the water with higher surface tension will flow to the end of the tilted perforated plate 566 and into the water chamber 568. While HFE-7100 is used as an example, such properties can be exploited with any kind of dielectric fluid that has a different kinematic viscosity than water.

The size of perforations or holes 572 in the tilted perforated plate 566 may vary based on the surface tension of the dielectric fluid. For example, a mesh size of about 60-200 may be effective to separate HFE-7100 from water. A mesh size of 80 implies that there are 80 holes across a square-inch area. A mesh size of 80 may include holes having diameters of about 0.18 mm. In another embodiment, the tilted perforated plate 566 may be replaced with a sieve. The sieve may be made of metal wire. The sieve may have a mesh size of about 60-200.

The apparatus 100 may also include a filtration system 575. The filtration system 575 may include a drying filter 590 that is, in some variations, fluidically connected to the liquid return passage 470 and disposed between the outlet 440 of the condensing chamber 430 and the inlet of the immersion tank 201. Preferably, the drying filter 590 may include a desiccant material.

The apparatus 100 may be constructed from metal, such as carbon steel. The immersion tank 201 may be constructed of metal with welded seams. Metal materials may be preferable over plastic materials, since metal materials may effectively prevent moisture transfer from the ambient environment to the dielectric fluid 620 in the tank 201. Minimizing moisture transfer to the dielectric fluid 620 is desirable to reduce dewatering demand placed on the water separator 565 and may also reduce dewatering demand on the desiccant material in the drying filter 590.

In some applications, the filtration system 575 may include an impurity filter 580. The impurity filter 580 may be fluidically connected to the liquid return passage 470 and disposed between the outlet of the drying filter 590 and the inlet of the immersion tank 201. The impurity filter 580 may include activated carbon, charcoal, and the like. The impurity filter 580 may capture any impurities or debris.

In some variations, the apparatus 100 may include a liquid return system. The liquid return system may be configured to return dielectric liquid 620, that has been condensed from dielectric vapor, to the immersion tank 201. The liquid return system may include a liquid pump 585. The liquid pump 585 may be fluidically connected to the liquid return passage 470 and disposed between the outlet 574 of the water separator 565 and the inlet to the immersion tank 201. For example, the liquid pump 585 may be located upstream of the filters 580, 590 or, alternatively may be located downstream of the filters 580, 590.

Due to its efficient design, the two-phase immersion cooling apparatus 100 may require significantly less dielectric fluid than competing designs that rely on relatively large internal or external reservoirs of subcooled fluid to function properly. Reducing fluid volume is desirable to reduce fluid cost, system weight, and system size. Minimizing size and weight may be particularly important in mobile applications and stationary applications where an engineered floor is not available to support the apparatus 100.

Figure 17:
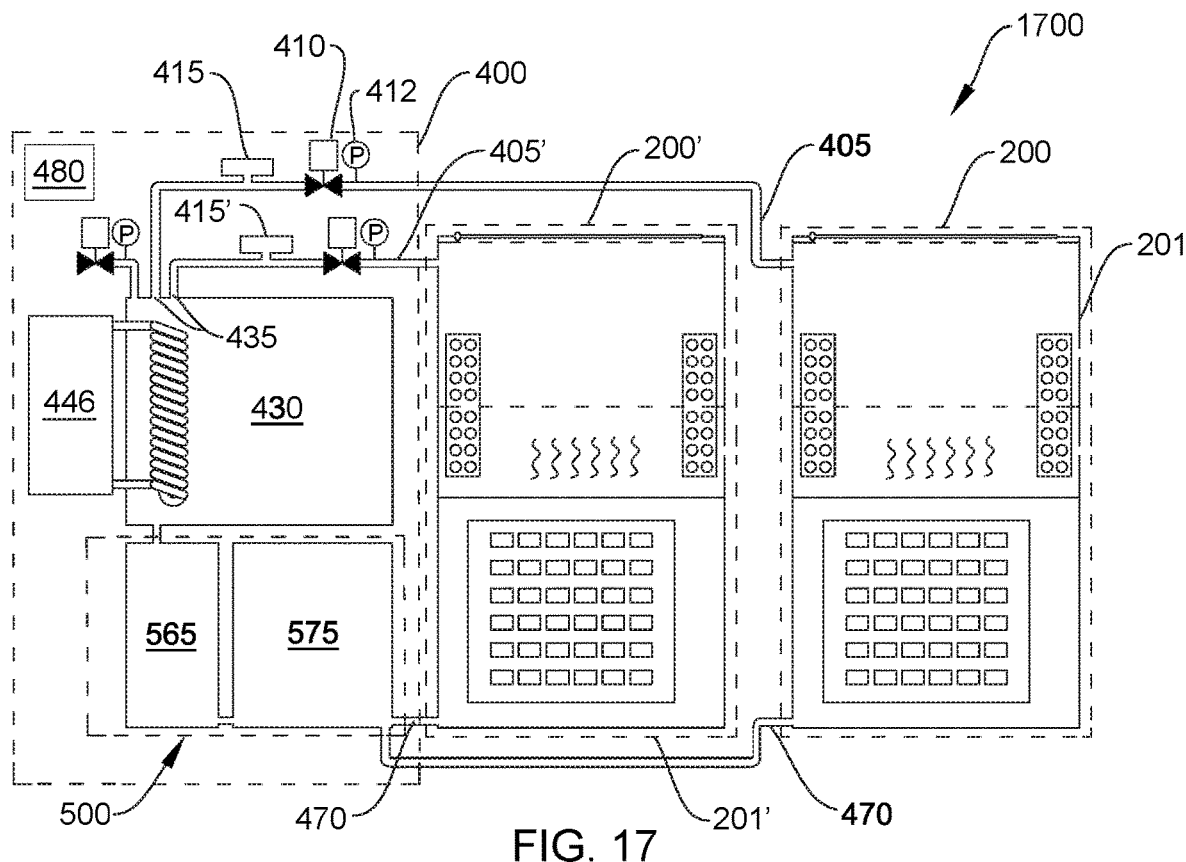
FIG. 17 shows an embodiment of a two-phase immersion cooling apparatus with two immersion tanks fluidically connected to a central vapor management system, in accordance with some embodiments of the present invention.

In some embodiments, the vapor management system 400 may only be needed periodically. For instance, when the electronic device 800 idles, operates below its maximum power rating, operates at relatively constant power with little variation, or the like, the vapor management system 400 may not be needed until the electronic device power increases. In other embodiments, the vapor management system 400 may be needed frequently but may have sufficient cooling capacity to serve multiple immersion tanks 201 simultaneously. In either scenario, a central vapor management system 400 may serve two or more immersion tanks 201, 201'. FIG. 17 shows an embodiment of a two-phase immersion cooling apparatus 1700 having a central vapor management system 400 fluidically connected to a first immersion tank assembly 200 and a second immersion tank assembly 200'. Employing a central vapor management system 400 may be less expensive than equipping each immersion tank 201, 201' with a separate vapor management system 400. Employing the central vapor management system 400 may conserve floor space in the data center 2000 (FIG. 4). Employing the central vapor management system 400 may reduce or simplify maintenance. Each immersion tank 201, 201' may be fluidically connected to the vapor management system 400 by a corresponding vapor supply passage 405, 405' and may be fluidically connected to the water separation and filtration assembly 500 by a liquid return passage 470.

The central vapor management system 400 may monitor tank pressure in each immersion tank 201, 201' (e.g., using a (e.g., pressure) sensor(s) 412) and receive dielectric vapor 615 from one tank 201, both tanks 201, 201', or neither tank as necessary to maintain tank pressures within acceptable ranges. For example, the central vapor management system 400 may receive vapor from the first immersion tank 201 when the first immersion tank pressure is at or above a first threshold pressure. The central vapor management system 400 may receive vapor from the second immersion tank 201' when the second immersion tank pressure is at or above a second threshold pressure.

Figure 18:
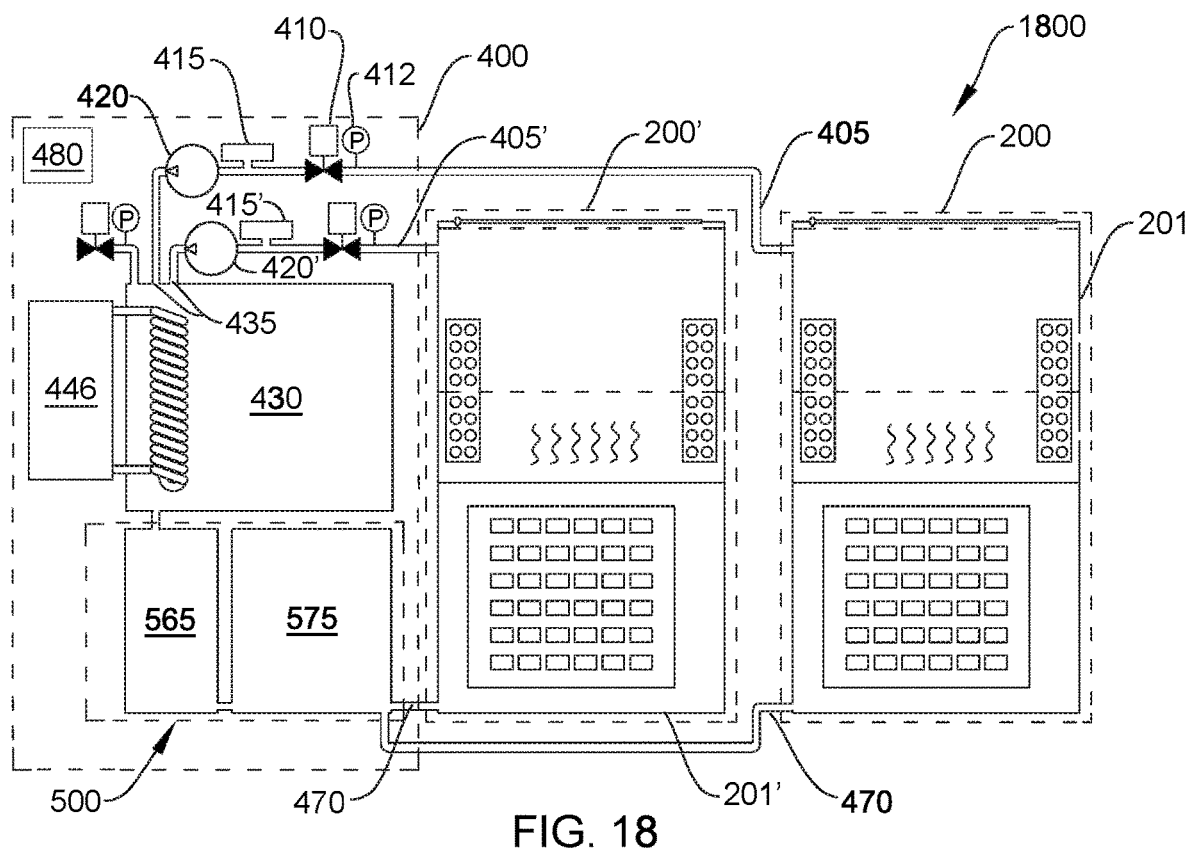
FIG. 18 shows the apparatus of FIG. 17 with a vapor pump fluidically connected between each immersion tank and the central vapor management system, in accordance with some embodiments of the present invention.

FIG. 18 shows a two-phase immersion cooling apparatus 1800 that varies from the apparatus 1700 of FIG. 17 by including a vapor pump 420, 420' that is fluidically connected between a corresponding immersion tank 201, 201' and the central vapor management system 400. Each vapor pump 420, 420' may be configured to purge a mixture of air and dielectric vapor from each immersion tank 201, 201' and force it into the condensing chamber 430. Each vapor pump 420, 420' may be located upstream of the condensing chamber 430. Each vapor pump 420, 420' may have an inlet and an outlet. The inlet of each vapor pump 420, 420' may be fluidically connected to the outlet of the corresponding variable volume chamber 415, 415'. The outlet of each vapor pump 420, 420' may be fluidically connected to the inlet 435 of the condensing chamber 430. Advantageously, each vapor pump 420 may be capable of reducing the pressure in a respective immersion tank below atmospheric pressure.

In some embodiments, the vapor management system 400 may be integrated into the two-phase immersion cooling apparatus 100 and be located in a common enclosure. In other embodiments, the vapor management system 400 may be included in a separate vapor processing apparatus 900, as shown in FIGS. 19-22, that fluidically connects to one or more immersion tank assemblies 200, 200'. The vapor processing apparatus 900 may retrofit to an existing two-phase immersion cooling apparatus 100 to boost vapor management capacity. For instance, if electronic devices 800 in the data center 2000 are upgraded and will consume more power than the electronic devices 800 being replaced, the cooling capacity of the two-phase immersion cooling apparatus 100 may need to be upgraded to manage the additional heat load. Rather than replacing the apparatus 100, alternatively, the vapor management system 400 may be added to the apparatus 100 to manage higher vapor production rates, allowing the existing immersion tank assemblies 200, 200' to be reused.

Figure 19:
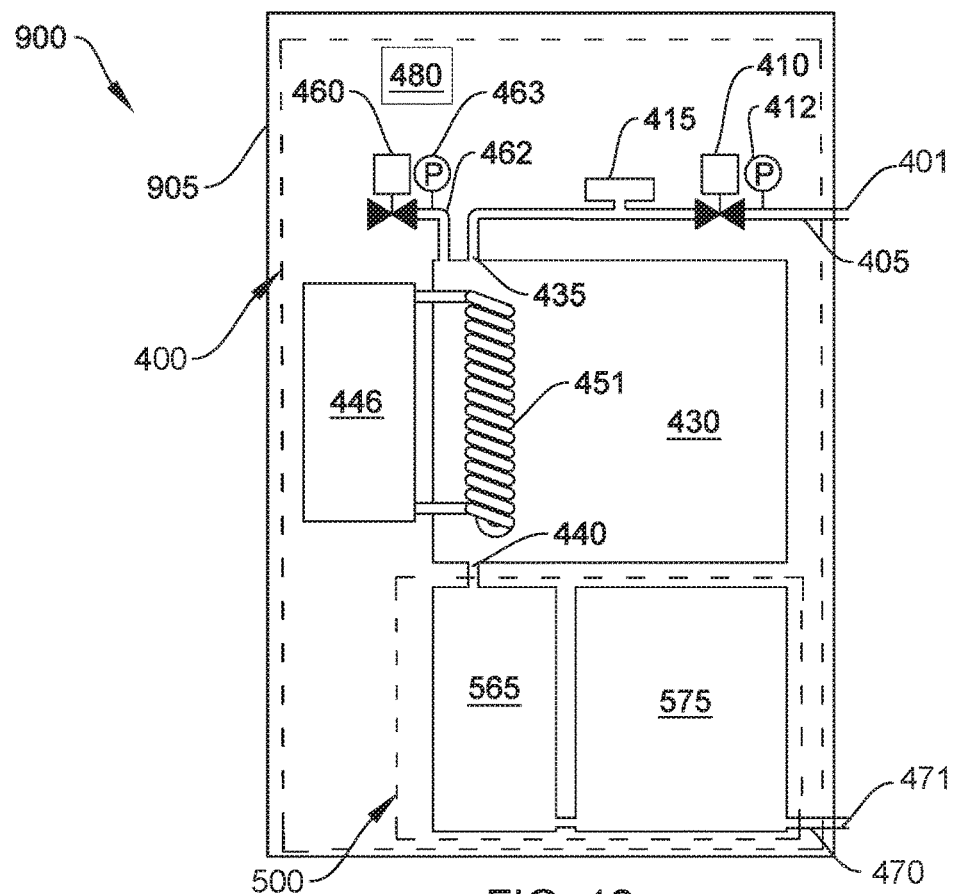
FIG. 19 shows a vapor processing apparatus, in accordance with some embodiments of the present invention.

In some implementations, the vapor processing apparatus 900 may include an enclosure 905, as shown in FIG. 19. The vapor processing apparatus 900 may include a vapor management system 400. The vapor management system 400 may include a vapor supply passage 405 having a vapor supply inlet 401. The vapor management system 400 may include a condensing chamber 430 having an inlet, an outlet, and an auxiliary condenser 451 in thermal communication with an interior volume of the condensing chamber 430. The vapor supply passage 405 may fluidically connect the vapor supply inlet 401 to the inlet 435 of the condensing chamber 430. The vapor management system 400 may include a flow control valve 410 in the vapor supply passage 405 between the vapor supply inlet 401 and the inlet 435 of the condensing chamber 430. The vapor management system 400 may include a liquid return passage 470 fluidically connecting the outlet 440 of the condensing chamber 430 to the liquid return outlet 471. The vapor management system 400 may include a variable volume chamber 415 fluidically connected to the vapor supply passage 405 between the vapor supply inlet 401 and the inlet 435 of the condensing chamber 430. The vapor management system 400 may also include a (e.g., pressure) sensor 412 located in the vapor supply passage 405 and configured to detect pressure within an immersion tank 201, when fluidically connected. The vapor management system 400 may further include a pressure relief valve 460 fluidically connected to the condensing chamber 430.

The vapor processing apparatus 900 may include a water separation and filtration assembly 500. The vapor processing apparatus 900 may include, as shown in FIG. 10, a water separator 565 and/or a filtration system 575. The filtration system 575 may include one or more of: a liquid pump 585, a drying filter 590, an impurity filter 580, and so forth.

Figure 2:
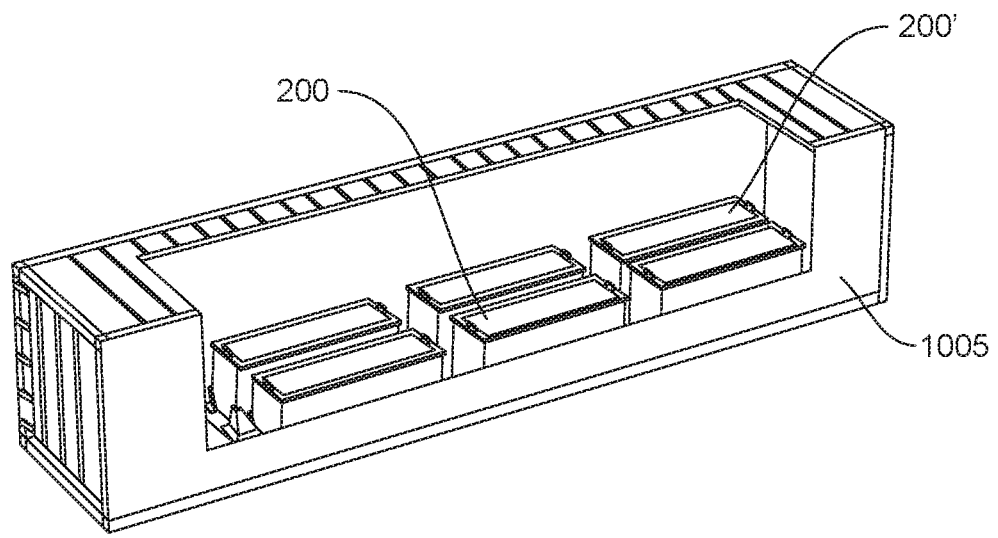
FIG. 2 shows a partial cutaway view of the modular data center of FIG. 1 exposing a plurality of immersion cooling tank assemblies within a container, in accordance with some embodiments of the present invention.
Figure 20:
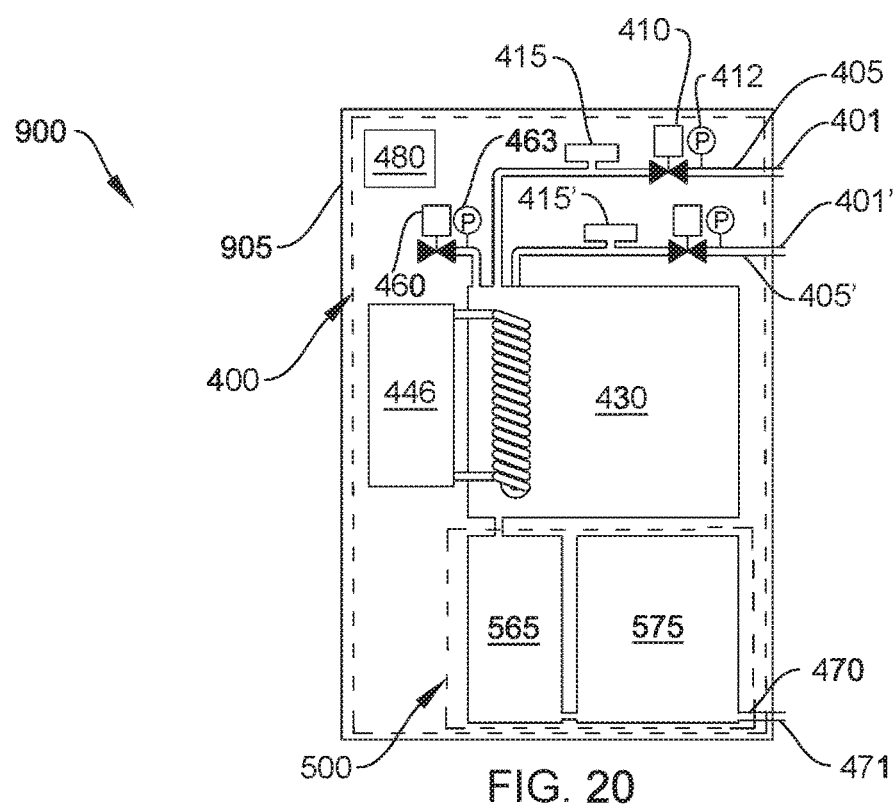
FIG. 20 shows a vapor processing apparatus with two vapor supply inlets, in accordance with some embodiments of the present invention.

FIG. 19 shows a vapor processing apparatus 900 having a single vapor supply inlet 401. FIG. 20 shows a vapor processing apparatus 900 having two vapor supply inlets 401, 401'. In other embodiments, the vapor processing apparatus 900 may have more than two vapor supply inlets 401, 401' to allow the apparatus 900 to receive vapor from more than two immersion tanks 201, 201'. In some embodiments, the vapor processing apparatus 900 may receive vapor from a grouping of immersion tanks. For instance, the vapor processing apparatus 900 may receive vapor from the groupings of immersion tanks 201, 201' disposed in a plurality of tank assemblies 200, 200', as shown in FIG. 2 or 4. Having a central vapor processing apparatus 900 may be more efficient and more cost-effective than having a vapor processing apparatus 900 for each immersion tank 200.

Figure 21:
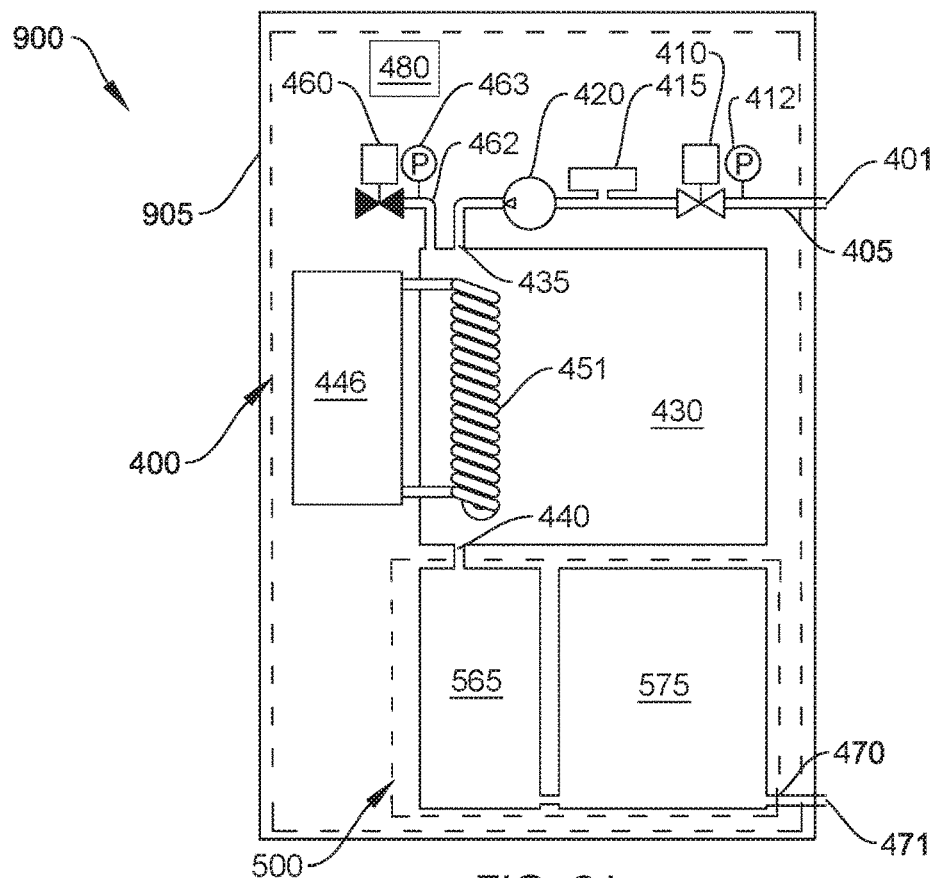
FIG. 21 shows a vapor processing apparatus with a vapor pump, in accordance with some embodiments of the present invention.
Figure 22:
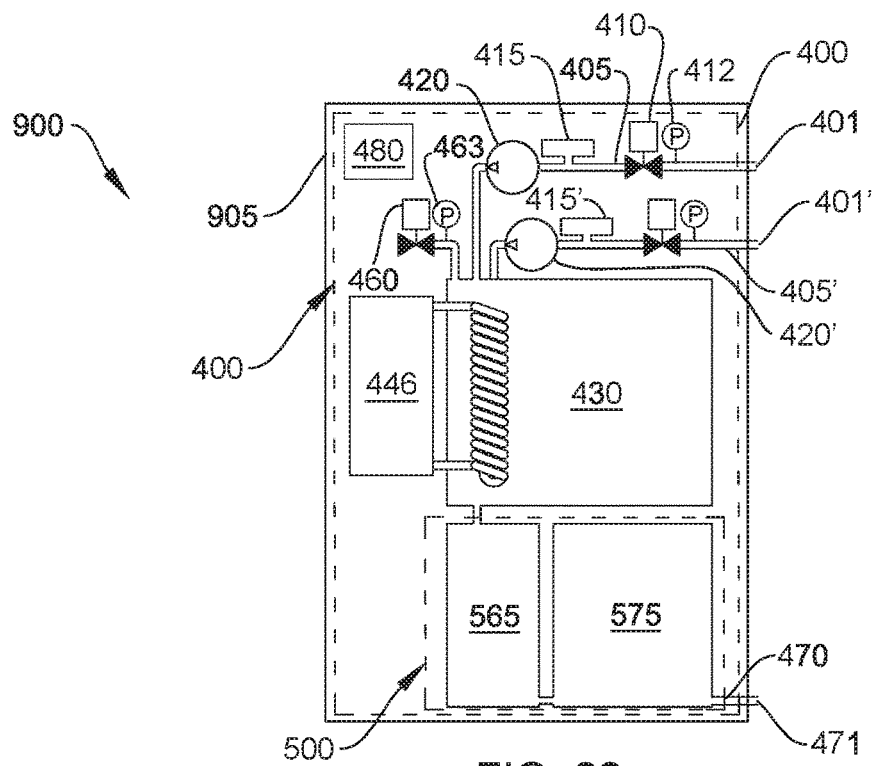
FIG. 22 shows a vapor processing apparatus with two vapor supply inlets and two vapor pumps, in accordance with some embodiments of the present invention.

In some variations, the vapor processing apparatus 900 may include a vapor pump 420 to allow the apparatus 900 to actively purge dielectric vapor 615 and air 705 (FIG. 5) from a headspace 206 (FIG. 5) of an immersion tank 200. FIG. 21 shows a vapor processing apparatus 900 with a single vapor supply inlet 401 and a single vapor pump 420 fluidically connected to the vapor management system 400. FIG. 22 shows a vapor processing apparatus 900 with two vapor supply inlets 401, 401' and corresponding vapor pumps 420, 420' fluidically connected to corresponding vapor supply passages 405, 405' of the vapor management system 400.

Methods of Operation

Prior to use, the immersion tank 201 may be partially filled with liquid dielectric fluid 620, as shown in FIG. 5. The remainder of the immersion tank 201 may be filled with air 705 at about atmospheric pressure (e.g., 1 atm). An interface between the liquid dielectric fluid 620 and air 705 may define a liquid line 605. In some implementations, the fluid 620 may be non-toxic. Furthermore, in some variations, the fluid 620 may be non-conductive and pose no risk to electronic devices.

Electronic devices 800 that require cooling, such as servers, switches, routers, firewalls, and the like, may be immersed in the fluid 620 within the immersion tank 201, as shown in FIG. 5. For example, the electronic devices 800 may be fully immersed and positioned below the liquid line 605. Power and communication cables (not shown) may extend from the electronic devices 800 to connection locations outside the immersion tank 201. The cables may pass through an opening in the lid 225 or tank wall. In another embodiment, the immersion tank 201 may include integrated connectors within the tank 201 to simplify cable management. In some applications, the electronic devices 800 may be arranged in a storage rack within the immersion tank 201.

Dielectric fluid 620 in the immersion tank 201 may initially be at about room temperature. After the electronic device(s) 800 is immersed in the fluid and powered on, the device 800 may begin generating waste heat as a byproduct of power consumption. The heat may be absorbed by the dielectric fluid 620. If heat flux from the device 800 is sufficiently high, localized boiling of the dielectric fluid 620 may occur. Boiling may produce vapor bubbles that ascend to the liquid line 605 through buoyancy and enter the headspace 206 of the immersion tank 201. The dielectric vapor 615 may be denser than air 705 and, consequently, a saturated vapor zone 625 may form atop the liquid line 605, as shown in FIG. 5. The layer of vapor may be referred to as a vapor blanket 625. When a rate of vapor production exceeds a rate of condensation, the depth of the vapor blanket 625 will grow. Eventually, the vapor level will approach the primary condenser 235. Heat transfer from the vapor 615 to the primary condenser 235 may promote condensing of the vapor 615 to liquid 620. The condensed liquid 620 will then passively return to the liquid bath.

When the electronic devices 800 are operating at steady state, the rate of vapor production and rate of condensing by the primary condenser 235 may reach equilibrium, resulting in a relatively constant vapor pressure within the immersion tank 201. Vapor pressure for HFE-7100 can be calculated using an Antoine equation shown below, where P is vapor pressure and T is temperature in degrees Celsius:

$$\ln P_{vapor} = 22.415 - 3641.9(1/(T+273))$$

Figure 6:
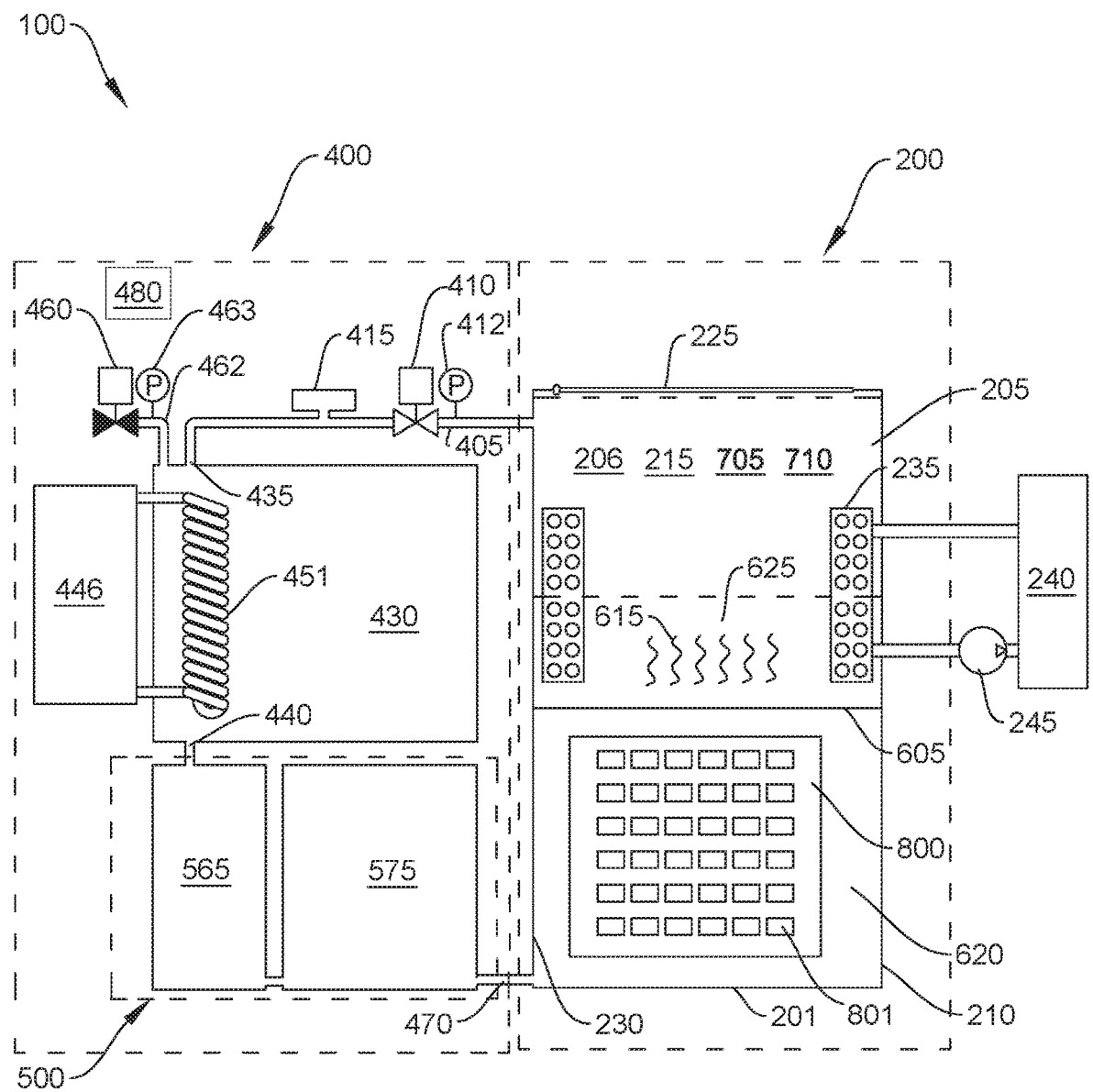
FIG. 6 shows the apparatus of FIG. 5 with an open flow control valve, in accordance with some embodiments of the present invention.
Figure 7:
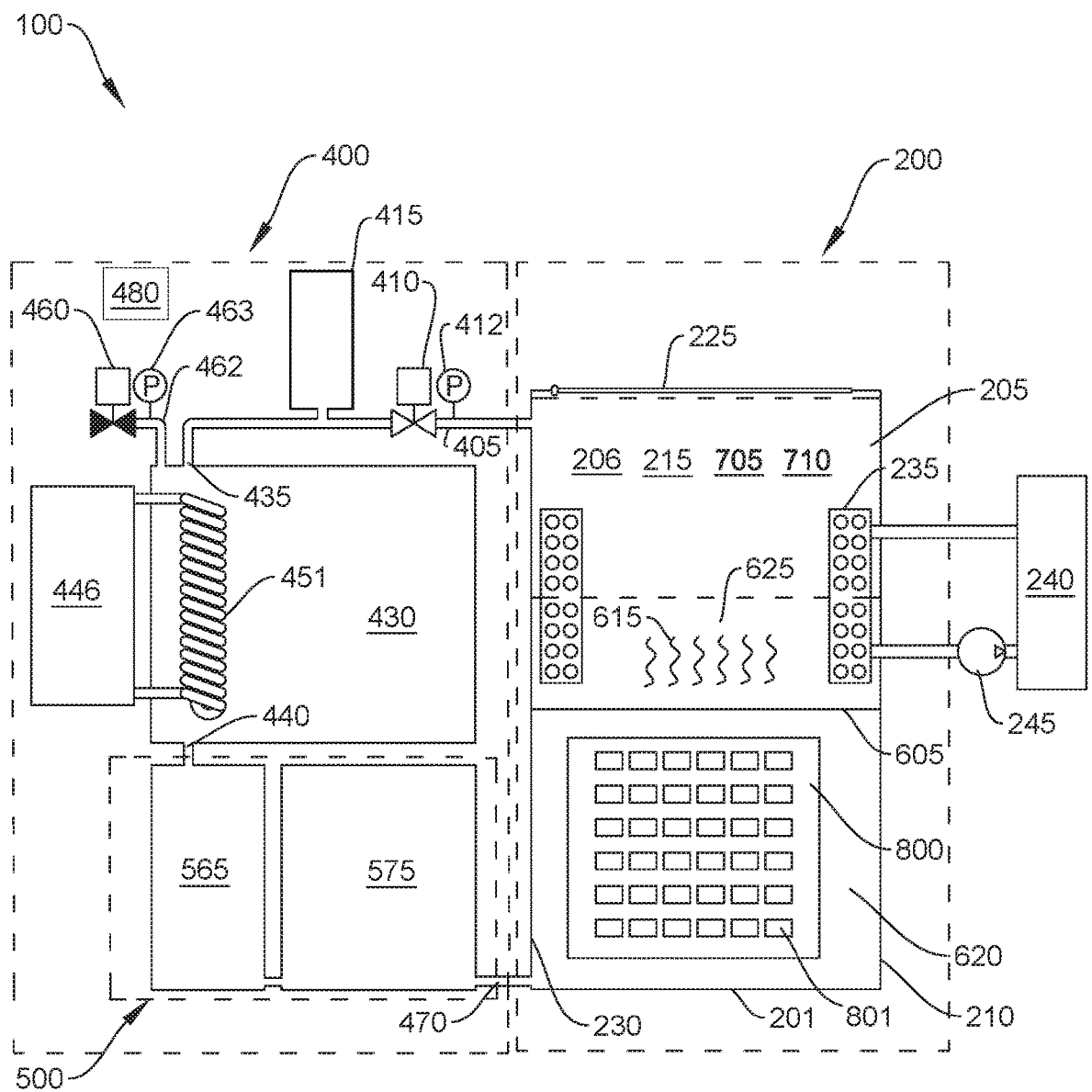
FIG. 7 shows the apparatus of FIG. 5 with an open flow control valve and expanded bellows, in accordance with some embodiments of the present invention.

When power consumption by the electronic device 800 increases, waste heat and vapor production will also increase. If elevated power consumption persists, at some point, the rate of vapor production may overwhelm the condensing capability of the primary condenser 235. Vapor pressure in the immersion tank 201 will then begin to rise. When pressure in the immersion tank 201 reaches a predetermined threshold, the valve 410 may open, as shown in FIG. 6, and vapor 615 will escape from the immersion tank 201 into the vapor management system 400. As the vapor management system 400 receives dielectric fluid vapor 615, air 705, and water vapor 710 from the headspace 206 of the immersion tank 201, the variable volume chamber 415 will expand, as shown in FIG. 7.

Figure 8:
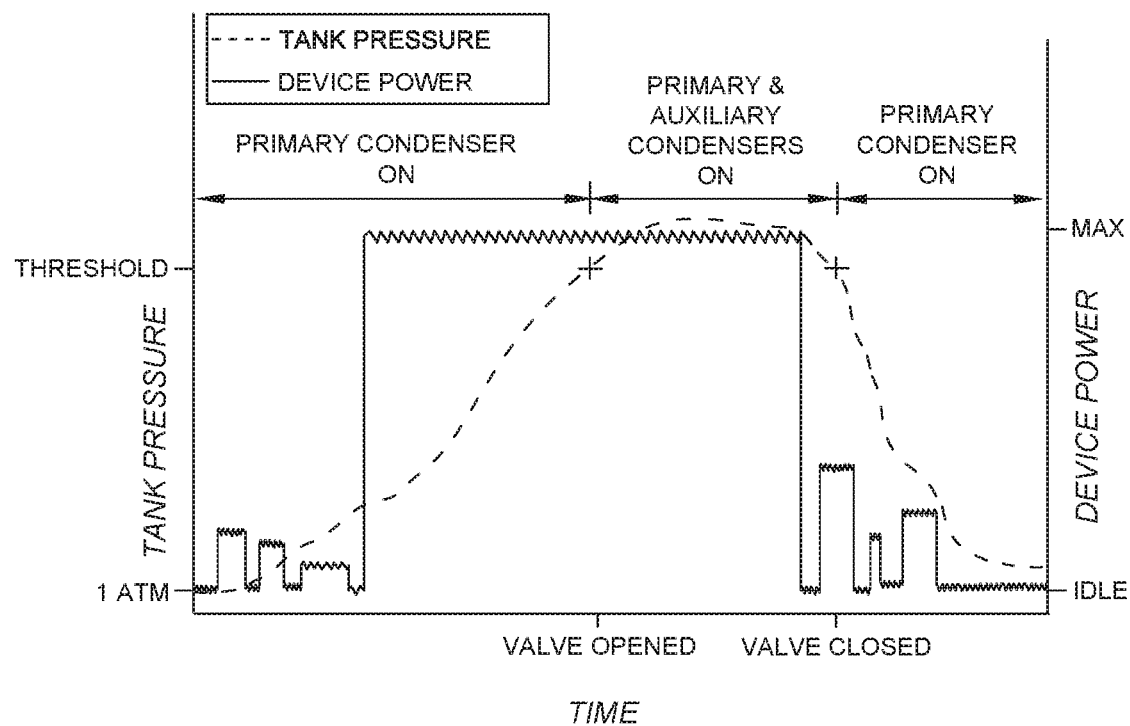
FIG. 8 shows a plot of immersion tank pressure and electronic device power consumption versus time, in accordance with some embodiments of the present invention.

FIG. 8 shows a plot of immersion tank 201 pressure and device 800 power consumption versus time. In this embodiment, the electronic device 800 operates at idle or low power for a period of time. During that time, vapor production may be managed entirely by the primary condenser 235, and the vapor management system 400 may remain in standby mode. Eventually, device power consumption may increase. Increased power consumption may produce more waste heat which, in turn, may produce more dielectric vapor 615. As vapor production increases, a condensing capacity of the primary condenser 235 may eventually be exceeded. As vapor 615, air 705, and water vapor 710 accumulate in the headspace 206, the immersion tank 201 pressure begins to rise until it reaches a predetermined threshold pressure setting. Upon reaching the predetermined threshold pressure setting, as shown in FIG. 6, the flow control valve 410 may be actuated (e.g., by signals from the (e.g., pressure) sensor 412), thereby allowing vapor 615, air 705, and water vapor 710 to escape from the immersion tank 201 and enter the vapor management system 400. Actuation of the flow control valve 410 may cause the vapor management system 400 to switch from standby mode to active mode and the chiller 446 to turn on or reduce its setpoint temperature to a level suitable to condense admitted vapor 615 and water vapor 710. As vapor 615, air 705, and water vapor 710 exit the immersion tank 201, the tank pressure may decrease. Eventually, the tank pressure may fall below the threshold pressure setting of the flow control valve 410, causing, as shown in FIG. 5, the flow control valve 410 to close and trap vapor 615, air 705, and water vapor 710 received from the immersion tank 201 in the vapor management system 400. The vapor 615 and water vapor 710 may then be condensed within the condensing chamber 430, optionally dewatered in the water separator 565, and further dried and filtered through the drying filter 590 and impurity filter 580, respectively, before being returned as dielectric liquid 620 to the immersion tank 201. The vapor management system 400 may cycle on and off as needed to receive and condense vapor 615 and water vapor 710 from the immersion tank 201 and thereby maintain pressure in the immersion tank 201 at or below a desired operating pressure.

In one embodiment, it may be desirable to anticipate a rise in vapor production that will necessitate activation of the vapor management system 400. A rise in vapor production may be anticipated by monitoring device power consumption. When device power consumption rises above a predetermined level or, alternately, above a predetermined level for a predetermined duration, the vapor management system 400 may switch from standby mode to active mode. Switching from standby mode to active mode may involve activating the chiller 446 or reducing the setpoint temperature of the chiller 446 to a level suitable to condense admitted vapor 615 and water vapor 710. This advance activation may allow sufficient time for the chiller 446 (FIG. 6) to reach a desired working temperature before the valve 410 is opened and vapor 615, air 705, and water vapor 710 are admitted from the immersion tank 201. This approach allows for energy conservation when the vapor management system 400 is in standby mode, since the chiller temperature and chiller power consumption can be reduced.

Figure 9:
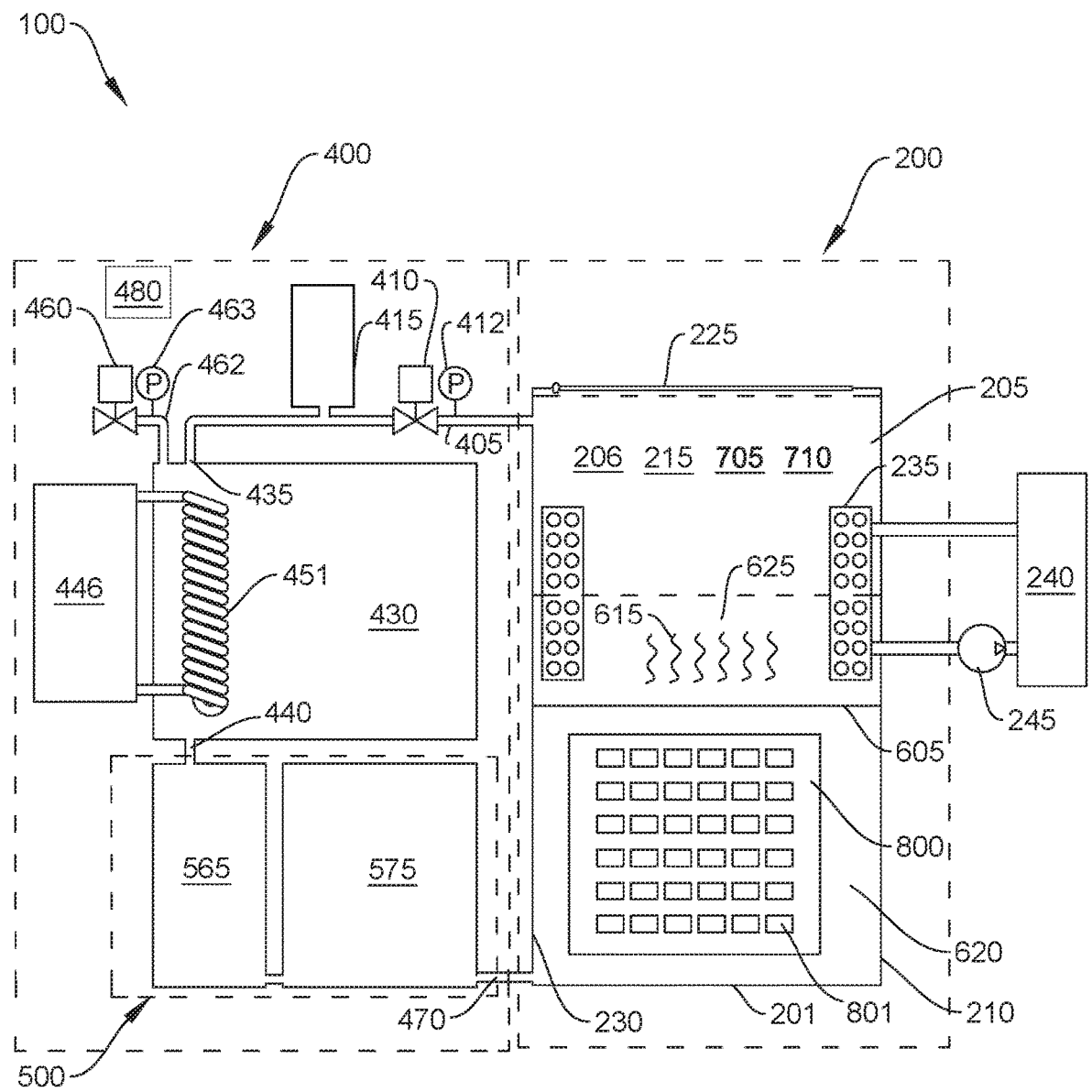
FIG. 9 shows the apparatus of FIG. 5 with an open pressure relief valve, in accordance with some embodiments of the present invention.

In some instances, an unexpected heat load may be present within the immersion tank 201 and must be safely mitigated. For example, an unexpected heat load may occur if an electronic device 800 malfunctions and exceeds a maximum power consumption rating. If this occurs, the amount of heat and vapor 615 and water vapor 710 generated may exceed the condensing capacity of the vapor management system 400. In practice, the flow control valve 410 will open (FIG. 6) when the tank pressure reaches the predetermined threshold setting of the flow control valve 410. As vapor 615, air 705, and water vapor 710 fill the vapor management system 400, the bellows 415 may be configured to expand to store additional vapor 615, air 705, and water vapor 710, as shown in FIG. 7. After the bellows 415 has fully expanded, if vapor production continues to increase, pressure in the vapor management system 400 (e.g., as measured by the (pressure) sensor 463) will continue to rise. To avoid mechanical failure due to over-pressurization, the pressure relief valve 460 may be configured to actuate, as shown in FIG. 9, when the pressure in the vapor management system 400 exceeds a maximum allowable pressure. Vapor 615, air 705, and water vapor 710 will then be discharged to the ambient environment, thereby reducing pressure in the vapor management system 400 and immersion tank 201 and mitigating risk of mechanical failure. Although venting vapor 615, air 705, and water vapor 710 to the ambient environment results in fluid loss, which is undesirable, fluid loss is preferable over safety risks associated with over-pressurization.

As used herein, the term "fluid" may refer to a substance in gas form, liquid form, or a two-phase mixture of gas and liquid. The fluid may be capable of undergoing a phase change from liquid to vapor or vice versa. The liquid may form a free surface that is not created by a container in which it resides, while the gas may not.

As used herein, the term "vapor" may refer to a substance in a gas phase at a temperature lower than the substance's critical temperature. Therefore, the vapor may be condensed to a liquid by increasing pressure without reducing temperature.

As used herein, the term "two-phase mixture" may refer to a vapor phase of a substance coexisting with a liquid phase of the substance. When this occurs, a gas partial pressure may be equal to a vapor pressure of the liquid.

The dielectric fluid 620 may be selected for use in the immersion cooling apparatus based on a variety of factors including operating pressure, temperature, boiling point, cost, or safety regulations that govern installation (e.g., such as regulations set forth in ASHRAE Standard 15 relating to permissible quantities of fluid per volume of occupied building space).

In some instances, fluid selection may be influenced by desired dielectric properties, desired boiling point, or compatibility with materials used to manufacture the immersion cooling system 100 and electronic devices 800 to be cooled. For instance, the fluid may be selected to ensure little or no permeability through system components and no harmful effects to device 800 components.

A dielectric fluid 620, such as a hydrofluorocarbon (HFC) or a hydrofluoroether (HFE), can be used as the fluid in the immersion cooling apparatus 100. Unlike water, dielectric fluids can be used in direct contact with electronic devices 800, such as microprocessors 801, memory modules, power inverters, and the like, without risk of shorting electrical connections.

Non-limiting examples of dielectric fluids include 1,1,1,3,3-pentafluoropropane (known as R-245fa), hydrofluoroether (HFE), 1-methoxyheptafluoropropane (known as HFE-7000), methoxy-nonafluorobutane (known as HFE-7100). Hydrofluroethers, including HFE-7000, HFE-7100, HFE-7200, HFE-7300, HFE-7500, and HFE-7600, are commercially available as NOVEC Engineered Fluids from 3M Company headquartered in Mapleton, Minnesota. FC-40, FC-43, FC-72, FC-84, FC-770, FC-3283, and FC-3284 are commercially available as FLUOROINERT Electronic Liquids also from 3M Company.

NOVEC 7100 has a boiling point of 61 degrees C., a molecular weight of 250 g/mol, a critical temperature of 195 degrees C., a critical pressure of 2.23 MPa, a vapor pressure of 27 kPa, a heat of vaporization of 112 kJ/kg, a liquid density of 1510 kg/m$^3$, a specific heat of 1183 J/kg-K, a thermal conductivity of 0.069 W/m-K, and a dielectric strength of about 40 kV for a 0.1 inch gap. NOVEC 7100 works well for certain electronic devices 800, such as power electronic devices 800 that produce high heat loads and can operate safely at temperatures above about 80 degrees C.

NOVEC 7100 can be used to cool a microprocessor 801 that has a preferred operating core temperature of about 60-70 degrees C. When the microprocessor 801 is idling and has a surface temperature below 61 degrees C., subcooled NOVEC 7100 near the microprocessor 801 may experience no local boiling. When the microprocessor 801 is fully utilized and has a surface temperature at or above 61 degrees C., NOVEC 7100 may experience vigorous local boiling and vapor production near the microprocessor.

NOVEC 649 Engineered Fluid is available from 3M Company. It is a fluoroketone fluid (C6-fluoroketone) with a low Global Warming Potential (GWP). It has a boiling point of 49 degrees C., a thermal conductivity of 0.059, a molecular weight of 316 g/mol, a critical temperature of 169 degrees C., a critical pressure of 1.88 MPa, a vapor pressure of 40 kPa, a heat of vaporization of 88 kJ/kg, and a liquid density of 1600 kg/m$^3$.

NOVEC 649 may be used to cool a microprocessor 801 that has a preferred operating core temperature of about 60-70 degrees C. When the microprocessor 801 is idling and has a surface temperature below 49 degrees C., subcooled NOVEC 649 near the microprocessor 801 may experience no local boiling. When the microprocessor 801 is fully utilized and has a surface temperature at or above 49 degrees C., NOVEC 649 may experience vigorous local boiling and vapor production near the microprocessor 801.

The elements and method steps described herein can be used in any combination whether explicitly described or not. All combinations of method steps as described herein can be performed in any order, unless otherwise specified or clearly implied to the contrary by the context in which the referenced combination is made.

As used herein, the singular forms "a," "an," and "the" include plural referents unless the content clearly dictates otherwise.

As used herein, the unit "psig" represents gauge pressure in pounds per square inch. A positive value indicates a pressure above atmospheric pressure. A negative value indicates a pressure below atmospheric pressure.

As used herein, the term "fluidically connected" can describe a first component directly connected to a second component or a first component indirectly connected to a second component by way of one or more intervening components, where fluid, in gas form, liquid form, or a two-phase mixture, may pass from the first component to the second component without escaping to the atmosphere.

Numerical ranges as used herein are intended to include every number and subset of numbers contained within that range, whether specifically disclosed or not. Further, these numerical ranges should be construed as providing support for a claim directed to any number or subset of numbers in that range. For example, a disclosure of 1-10 should be construed as supporting a range of from 2 to 8, from 3 to 7, from 5 to 6, from 1 to 9, from 3.6 to 4.6, from 3.5 to 9.9, and so forth.

The methods and compositions of the present invention can comprise, consist of, or consist essentially of the structural elements and process step limitations described herein, as well as any additional or optional steps, components, or limitations described herein or otherwise useful in the art.

It is understood that the invention is not confined to the particular construction and arrangement of parts herein illustrated and described, but embraces such modified forms thereof as come within the scope of the claims.

The foregoing description has been presented for purposes of illustration and description. It is not intended to be exhaustive or to limit the claims to the embodiments disclosed. Other modifications and variations may be possible in view of the above teachings. The embodiments were chosen and described to explain the principles of the invention and its practical application to enable others skilled in the art to best utilize the invention in various embodiments and various modifications as are suited to the particular use contemplated. It is intended that the claims be construed to include other alternative embodiments of the invention except insofar as limited by the prior art.

What is claimed is:

1. A two-phase immersion cooling apparatus comprising:
   an immersion tank comprising an upper portion, a lower portion, and a primary condenser in thermal communication with an interior volume of the immersion tank; and
   a vapor management system fluidly connected to the immersion tank, the vapor management system comprising:
      a condensing chamber having an inlet, an outlet, and an auxiliary condenser in thermal communication with an interior volume of the condensing chamber;
      a vapor supply passage fluidly connecting the upper portion of the immersion tank to the inlet of the condensing chamber;
      a valve in the vapor supply passage between the upper portion of the immersion tank and the inlet of the condensing chamber; and
      a liquid return passage fluidly connecting the outlet of the condensing chamber to the immersion tank.

2. The two-phase immersion cooling apparatus of claim 1, further comprising a variable volume chamber fluidly connected to the vapor supply passage between the upper portion of the immersion tank and the inlet of the condensing chamber, wherein the condensing chamber is a fixed volume condensing chamber.

3. The two-phase immersion cooling apparatus of claim 1, further comprising a pressure relief valve fluidly connected to the condensing chamber.

4. The two-phase immersion cooling apparatus of claim 1, further comprising a pressure sensor located in the immersion tank or in the vapor supply passage and configured to detect pressure within the immersion tank.

5. The two-phase immersion cooling apparatus of claim 1, further comprising:
   an exhaust passage fluidly connected to the condensing chamber;
   a pressure relief valve in the exhaust passage; and
   a pressure sensor located in the vapor management system and configured to detect pressure within the vapor management system.

6. The two-phase immersion cooling apparatus of claim 1, further comprising a water separator fluidly connected to the liquid return passage between the outlet of the condensing chamber and the immersion tank.

7. The two-phase immersion cooling apparatus of claim 1, further comprising a liquid pump fluidly connected to the liquid return passage between the outlet of the condensing chamber and the immersion tank.

8. The two-phase immersion cooling apparatus of claim 1, further comprising a drying filter fluidly connected to the liquid return passage between the outlet of the condensing chamber and the immersion tank.

9. The two-phase immersion cooling apparatus of claim 1, further comprising an impurity filter fluidly connected to the liquid return passage between the outlet of the condensing chamber and the immersion tank.

10. The two-phase immersion cooling apparatus of claim 1, further comprising a vapor pump fluidly connected to the vapor supply passage between the upper portion of the immersion tank and the inlet of the condensing chamber.

11. A two-phase immersion cooling apparatus comprising:
    an immersion tank comprising an upper portion, a lower portion, and a primary condenser in thermal communication with an interior volume of the immersion tank; and a vapor management system fluidly connected to the immersion tank, the vapor management system comprising:
  a condensing chamber having an inlet, an outlet, and an auxiliary condenser in thermal communication with an interior volume of the condensing chamber;
  a vapor supply passage fluidly connecting the upper portion of the immersion tank to the inlet of the condensing chamber;
  a solenoid valve in the vapor supply passage between the upper portion of the immersion tank and the inlet of the condensing chamber;
  a liquid return passage fluidly connecting the outlet of the condensing chamber to the immersion tank;
  a pressure sensor configured to detect pressure in the immersion tank; and
  an electronic control unit configured to receive a pressure signal from the pressure sensor and send a command signal to the solenoid valve.

12. The two-phase immersion cooling apparatus of claim 11, wherein the pressure sensor is located in the immersion tank or in the vapor supply passage between the solenoid valve and the immersion tank.

13. The two-phase immersion cooling apparatus of claim 11, wherein the condensing chamber has a volume at least 10% as large as a headspace volume of the immersion tank.

14. The two-phase immersion cooling apparatus of claim 11, further comprising a chiller fluidly connected to the auxiliary condenser.

15. The two-phase immersion cooling apparatus of claim 11, further comprising a dry cooler fluidly connected to the primary condenser.

16. A method comprising:
providing a two-phase immersion cooling apparatus comprising:
  an immersion tank comprising an upper portion, a lower portion, and a primary condenser in thermal communication with an interior volume of the immersion tank; and
  a vapor management system comprising:
    a condensing chamber having an inlet, an outlet, and an auxiliary condenser in thermal communication with an interior volume of the condensing chamber;
    a vapor supply passage fluidly connecting the upper portion of the immersion tank to the inlet of the condensing chamber;
    a valve in the vapor supply passage between the upper portion of the immersion tank and the inlet of the condensing chamber; and
    a liquid return passage fluidly connecting the outlet of the condensing chamber to the immersion tank;
detecting a pressure within the immersion tank;
  opening the valve when the pressure is greater than a predetermined threshold setting and admitting dielectric vapor from the immersion tank into the condensing chamber;
  closing the valve when the pressure in the immersion tank is less than the predetermined threshold setting;
  condensing the dielectric vapor to a liquid in the condensing chamber; and
  returning the liquid to the immersion tank through the liquid return passage.

17. The method of claim 16, further comprising circulating a coolant through the primary condenser, the coolant having a temperature greater than or equal to an ambient air temperature.

18. The method of claim 16, further comprising:
circulating a first coolant through the primary condenser; and
circulating a second coolant through the auxiliary condenser,
wherein a temperature of the first coolant is greater than a temperature of the second coolant.

19. The method of claim 16, further comprising:
providing a vapor pump fluidly connected to the vapor supply passage between the upper portion of the immersion tank and the inlet of the condensing chamber; and
operating the vapor pump while the valve is open to purge gas from a headspace of the immersion tank and reduce the pressure within the immersion tank below atmospheric pressure.

20. The method of claim 16, wherein the predetermined threshold setting is between −0.9 psig and 0.9 psig.

* * * * *